US006989566B2

(12) United States Patent
Noda et al.

(10) Patent No.: US 6,989,566 B2
(45) Date of Patent: Jan. 24, 2006

(54) HIGH-VOLTAGE SEMICONDUCTOR DEVICE INCLUDING A FLOATING BLOCK

(75) Inventors: Masaaki Noda, Shiga (JP); Teruhisa Ikuta, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/160,118

(22) Filed: Jun. 4, 2002

(65) Prior Publication Data

US 2002/0179974 A1 Dec. 5, 2002

(30) Foreign Application Priority Data

Jun. 4, 2001 (JP) ........................................ 2001-168746

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ....................... 257/339; 257/401; 257/409; 257/487

(58) Field of Classification Search ................ 257/339, 257/350, 355, 358, 367, 368, 369, 379, 401, 257/409, 487, 488, 489, 490, 499, 500, 516, 257/532, 533
See application file for complete search history.

(56) References Cited

U.S. PATENT DOCUMENTS

| 4,290,077 A | 9/1981 | Romen |
| 4,926,243 A | 10/1981 | Sato |
| 4,614,959 A | 9/1986 | Nakagawa |
| 4,811,075 A | 3/1989 | Eklund |
| 5,500,387 A * | 3/1996 | Tung et al. .................. 438/384 |
| 5,881,657 A | 1/1999 | Ranjan |
| 5,880,497 A * | 3/1999 | Ikeda et al. .................. 257/298 |
| 6,180,948 B1 | 2/2001 | Seok |
| 5,236,100 A1 | 5/2001 | Pemyeszi |
| 6,310,374 B1 | 10/2001 | Satoh et al. |
| 6,376,691 B1 | 4/2002 | Nagatani et al. |
| 6,492,689 B2 * | 12/2002 | Yamauchi et al. .......... 257/379 |
| 6,596,575 B2 | 7/2003 | Nagatani et al. |
| 6,603,185 B1 | 8/2003 | Jimbo et al. |
| 6,628,645 B2 | 12/2004 | Jimbo et al. |

FOREIGN PATENT DOCUMENTS

| EP | 0 967 660 A2 | 12/1999 |
| JP | 56-083076 | 7/1981 |
| JP | 58-127361 | 7/1983 |
| JP | 61-168253 | 7/1986 |
| JP | 2556172 B2 | 9/1996 |
| JP | 09-186241 | 7/1997 |
| JP | 10-163489 | 6/1998 |
| JP | 11-251309 | 9/1999 |
| JP | 2000-12854 A | 1/2000 |
| JP | 2000-294803 | 10/2000 |

OTHER PUBLICATIONS

Specifications and Drawings for patent application Ser. No. 09/736,230, "High–Voltage Semiconductor Device" Inventors: Masaaki Noda et al.

* cited by examiner

Primary Examiner—Hoai Pham
(74) Attorney, Agent, or Firm—McDermott Will & Emery LLP

(57) ABSTRACT

A high-voltage semiconductor device includes: a semiconductor region; a doped contact region; an isolating region; a metal electrode which is electrically connected with the doped contact region; and floating plate electrodes. A section of the metal electrode is extended onto an interlayer dielectric film and located over the respective plate electrodes. The extended section is capacitively coupled to the plate electrodes, respectively. A CMOS circuit, a resistor, a capacitor are formed in a portion of the semiconductor region which is surrounded with the doped contact region.

17 Claims, 24 Drawing Sheets

HIGH-VOLTAGE SEMICONDUCTOR DEVICE INCLUDING A FLOATING BLOCK

BACKGROUND OF THE INVENTION

The present invention relates to high-breakdown-voltage semiconductor devices (hereinafter referred to as "high-voltage semiconductor devices"), and more particularly relates to high-voltage semiconductor devices for controlling inverters.

A system for controlling inverters in lighting applications is illustrated in FIG. 16, as an example in which a conventional inverter-control high-voltage semiconductor device is employed. FIG. 16 schematically illustrates the structure of the lighting inverter-control system.

The inverter control system shown in FIG. 16 includes: an LC resonance circuit including a fluorescent lamp 100; high-breakdown-voltage n-channel power MOSFETs 101 and 102 for supplying power to the fluorescent lamp 100; a high-voltage-end drive circuit 105 for driving the high-voltage n-channel power MOSFET 101; and a low-voltage-end drive circuit 106 for driving the high-voltage n-channel MOSFET 102. The high-voltage-end drive circuit 105 is constituted by a high-voltage semiconductor device for inverter control. Here, the high-voltage power MOSFETs 101 and 102 are discrete elements. The inverter control system further includes: a high-voltage diode 104 for applying a source voltage V2 to the high-voltage-end drive circuit 105; a capacitor 103; a fluorescent-lamp-drive high-voltage power supply terminal 110; a power supply terminal 107 for the low-voltage-end drive circuit 106; and an output terminal 109 for driving the fluorescent lamp.

V1, applied for fluorescent lamp drive to the high-voltage power supply terminal 110, is a direct current voltage rectified from the alternating current power source, and V1 is a high voltage that is at maximum on about 600 V. Meanwhile, V3, applied to the power supply terminal 107 for the low-voltage-end drive circuit 106, is a power-supply voltage for the low-voltage-end drive circuit 106, and is a low voltage normally on about 15 V. V2, applied to a power supply terminal 108 for the high-voltage-end drive circuit 105, is defined by the low-voltage-end drive circuit voltage V3, the high-voltage diode 104, the capacitor 103, and the n-channel high-voltage power MOSFETs 101, 102. And V2 changes within a range from about the 15 V voltage of V3 to on about a 615 V voltage that is (V1+V3), in accordance with the ON/OFF functioning of the high-voltage power MOSFETs 101 and 102.

Next, the operation of the lighting inverter control system will be described.

First, in its initial state in which V3=15 V and V1=600 V are applied, an output terminal voltage V4 for driving the fluorescent lamp 100 is normally set close to the ground potential GND. So, in this state, the capacitor 103 is charged by powering the high-voltage diode 104 in the forward direction, and then V2 is set to a voltage given by subtracting the forward direction voltage of the high-voltage diode 104 from V3=15 V.

Next, the high-voltage n-channel power MOSFET 102 is turned OFF by a low-voltage-end control signal, and the high-voltage power MOSFET 101 is turned ON by a high-voltage-end control signal. Thus, the capacitor in the LC resonance circuit including the fluorescent lamp 100 is charged. At this point, when the high-voltage power MOSFET 101 is turned ON, the output terminal voltage V4 for driving the fluorescent lamp 100 elevates from near the ground potential GND to a potential on about V1=600 V (a voltage given by subtracting the ON voltage of the high-voltage MOSFET 101 from the voltage V1). Therein, the capacitor 103 has been charged and thus the potential difference between the voltage V2—which will substantially be the supply voltage for the high-voltage-end drive circuit 105—and the output terminal voltage V4 may be kept at the initial voltage of about V3—which is a potential on about 15 V (the voltage given by subtracting the forward direction voltage of the high-voltage diode 104 from V3). In this manner, the voltage V2 is elevated from a potential of about V3=15 V to a potential on about(V1+V3)=615 V.

Thereafter, the high-voltage n-channel power MOSFET 101 is turned OFF by the high-voltage-end control signal and the high-voltage n-channel power MOSFET 102 is turned ON by the low-voltage-end control signal, whereby the fluorescent lamp 100 is discharged. At this point, when the high-voltage power MOSFET 102 is turned ON, the output terminal voltage V4 for driving the fluorescent lamp is lowered from a potential of about V1=600 V (the voltage given by subtracting the ON voltage of the high-voltage MOSFET 101 from the voltage V1) to near the ground potential GND (a potential given by adding the ON voltage of the high-voltage MOSFET 102 to the ground potential GND). Therein, the capacitor 103 has been charged and thus the potential difference between the voltage V2—which will substantially be the supply voltage for the high-voltage-end drive circuit 105—and the output terminal voltage V4 may be kept at the initial voltage of about V3=15 V (the voltage given by subtracting the high-voltage diode 104 forward voltage from V3). In this manner, the voltage V2 is lowered from a potential on about (V1+V3)=615 V to about V3=15 V.

The above-described operation is a single-cycle functioning of the fluorescent-lamp-containing LC resonance circuit, during which it is charged and discharged.

In recent years, there have been studies on integrating the low-voltage-end drive circuit (106 in FIG. 16), the high-voltage-end drive circuit (105 in FIG. 16), and other control circuits in an inverter control system used in lighting uses. A high-voltage-end drive circuit of this type (105 in FIG. 16) is a circuit block that is generally referred to as a "floating block," and its power supply terminal 108 is not biased by a fixed voltage, and the terminal 108 is electrically floating. FIG. 17 illustrates the cross-sectional structure of a floating block that has been integrated.

The floating block depicted in FIG. 17 includes: a p-type semiconductor substrate 1; a lightly n-type doped semiconductor region 2 formed in the substrate 1; an n-type doped region 3; a p-type doped isolating region 4 that electrically isolates adjacent circuit elements; a heavily n-type doped contact region 6 for applying a potential of the power supply terminal 108 to the semiconductor region 2; a metal electrode 25 for applying the potential to the semiconductor region 2; and a metal electrode 33 for applying a potential to the isolating region 4 and the p-type semiconductor substrate 1.

A thin oxide film 15 and a thick oxide film 16 are formed between the isolating region 4 and the contact region 6. On the oxide films 15 and 16, plate electrodes 17b, 18b and 19b, which are made of polysilicon, are formed; plate electrode 17b is set at a potential equal to that of metal electrode 33; plate electrode 18b is electrically floating; and plate electrode 19b is connected with metal electrode 25. An interlayer dielectric film 34 is deposited over the plate electrodes 17b, 18b and 19b; and metal electrodes 40 and 41 that are electrically floating are formed on the interlayer dielectric film 34. A protective film 35 is formed over the metal electrodes 40 and 41, and a plastic encapsulant (resin for encapsulation) 36 is further formed on the protective film 35.

In the structure shown in FIG. 17, CMOSs, capacitors, resistors, and like elements constituting a high-voltage-end drive circuit are formed in the region surrounded by the contact region 6. This region will hereinafter be referred to as the "high-voltage-end drive circuit element region."

In the high-voltage-end drive circuit element region shown in FIG. 17, an n-channel MOS p-type doped body region 7, n-channel MOS n-type source and drain regions 8 and 9 that are formed in the p-type doped body region 7, and an n-channel MOS polysilicon gate electrode 22, each of which constitutes a part of the high-voltage-end drive circuit, are formed. Source and drain metal electrodes 26 and 27 are connected to the n-type source and drain regions 8 and 9. Further, p-channel MOS p-type source and drain regions 10 and 11, a p-channel MOS polysilicon gate electrode 23, and also p-channel MOS source and drain metal electrodes 28 and 29, each of which constitutes a part of the high-voltage-end drive circuit, are formed. These components make up a CMOS transistor element.

Moreover, a p-type doped region 12 that serves as one electrode of the capacitor element, a metal electrode 30 connected to the p-type doped region 12, and a polysilicon electrode 24 that serves as the other electrode of the capacitor element are formed in the high-voltage-end drive circuit region, making up a capacitor element. Further, therein, a p-type doped resistor 13 that constitutes a part of the high-voltage-end drive circuit, and metal electrodes 31 and 32 for the p-type doped resistor 13 are formed, making up a resistor element.

In the structure shown in FIG. 17, the source voltage V2 from the high-voltage-end drive circuit shown in FIG. 16 is applied to the metal electrode 25. The ground potential GND is applied to the metal electrode 33 that is connected to the isolating region 4. Herein, the n-channel MOS p-type doped body region 7 constituting a part of the CMOS is put to the potential V4 of the high-voltage-end drive circuit.

As can be understood from the above-described operation of the lighting inverter control system, the metal electrode 25, polysilicon plate electrode 19b, and n-doped contact region 6, which are given the voltage V2, vary from a low voltage of about 15 V to a high voltage of about 615 V. On the other hand, since the potential V4 from FIG. 16 becomes the potential of the n-channel MOS p-type doped body region 7 in FIG. 17, the potential of the p-type doped body region 7 varies from near the ground potential GND to a potential on about V1=600 V. Therein, the difference in potential between the p-type doped body region 7, and the metal electrode 25, plate electrode 19b, and heavily doped contact region 6 is kept at about 15 V.

Accordingly, a high voltage on about 615 V is applied to the p-n junctions in between the p-type semiconductor substrate 1 and isolating region 4, and the n-type semiconductor region 2. In the structure shown in FIG. 17, the plate electrodes 17b, 18b and 19b are a variety of field plates, and the plate electrodes are capacitively coupled to the floating metal electrodes 40 and 41 through the interlayer dielectric film 34 formed over the electrodes 17b, 18b and 19b. And the plate electrodes, thereby, divides the potential difference that is across the metal electrode 25 and plate electrode 17b, so that the distribution of the potential at the surface of the semiconductor region 2 is not concentrated locally.

FIG. 18 is a plan view depicting the structure of the floating block shown in FIG. 17. For ease of illustration, only the polysilicon plate electrodes 17b, 18b and 19b, metal electrodes 25, 33, 40 and 41 and contact region 6 are set out in FIG. 18.

Each of the polysilicon plate electrodes 17b, 18b and 19b has a predetermined width and is in the shape of an approximately rectangular loop having arcuate corners. Each of the metal electrodes 25, 33, 40 and 41, located over the plate electrodes 17b, 18b and 19b, also has a predetermined width and is also in the shape of an approximately rectangular loop having arcuate corners, but one section thereof is cut away. The cut-away sections are formed with a metal wiring 49 for propagating the high-voltage-end drive circuit control signal. Thus, elements for the high-voltage-end drive circuit are disposed in the region surrounded by the metal electrode 25 and the contact region 6.

Next, how the structure illustrated in FIGS. 17 and 18 realizes a high-voltage semiconductor device will be described. FIG. 19 illustrates parasitic capacitances present in the structure shown in FIG. 17. Meanwhile FIG. 20 illustrates profile of the distribution of potentials ("potential profile" hereinafter) when a high voltage (e.g., 600 V) is applied to the device having the structure shown in FIG. 17. In FIG. 20, dashed lines indicate equipotential lines for each of the potentials.

As shown in FIG. 19, a parasitic capacitance C1 is present between the plate and floating metal electrodes 17b and 40; a parasitic capacitance C2 is present between the floating metal and plate electrodes 40 and 18b; a parasitic capacitance C3 is present between the plate and floating metal electrodes 18b and 41; and a parasitic capacitance C4 is present between the floating metal and plate electrodes 41 and 19b. A series circuit, formed by these parasitic capacitances C1 through C4, acts to divide the voltage, thereby establishing a potential at the plate electrode 18b and imparting a suitable potential profile in the semiconductor region 2. Enabling an appropriate potential profile to be imparted in this way realizes a semiconductor device having a high breakdown voltage. It should be noted that parasitic capacitances C5 and C6, occurring between the metal electrodes 40 and 41 and plastic encapsulant 36 shown in FIG. 19, are normally considered non-existent as will be described later.

Referring next to FIG. 20, a potential profile of the conventional high-voltage semiconductor device at room temperature is schematically illustrated. The present inventors confirmed that the potential profiles illustrated in FIG. 20, and results of simulations that the inventors carried out showed similar tendencies.

The potential profile illustrated in FIG. 20 was obtained wherein a ground potential of 0 V was applied to the substrate 1, isolating region 3, plate electrode 17b and metal electrode 33, and a voltage of 600 V was applied to the contact region 6, plate electrode 19b and metal electrode 25. As may be understood form FIG. 20, when the same 600 V high potential as that of the contact region 6 is applied to the plate electrode 19b, an intermediate potential between 600 V and 0 V will be imparted to the plate electrode 18b. Accordingly, the equipotential lines, representing the potential profile of the semiconductor region 2, extend vertically to the surface of the semiconductor region 2, and are distributed almost equidistantly from each other. This as a result lets the concentration of electric field in the semiconductor region 2 be reduced, which maintains the high breakdown voltage characteristics of the transistor.

However, if the device is operated at an elevated ambient temperature of 150° C. while a high voltage of 500 V or more (e.g. 600 V) is still being applied to the metal electrode 25, then a phenomenon arises in which the breakdown voltage (i.e., the breakdown voltage between the terminal 108 in FIG. 16 to which the voltage V2 is applied, and the ground potential GND) between the metal electrodes 25 and 33 deteriorates. This phenomenon can be simulated by a life test called "high-temperature bias test". When the voltage applied to the metal electrode 25 is increased in the high-temperature bias test, the deterioration in breakdown voltage becomes striking; when the applied voltage is reduced, the breakdown voltage deterioration tends to be less.

The mechanism behind the deterioration in breakdown voltage between the metal electrode 25 and GND in the high-temperature bias test is unclear and does not go beyond the realm of speculation. Nevertheless, the following may be speculated.

In general, a semiconductor chip is packaged with a plastic encapsulant to prevent water or moisture from entering the plastic package. However, novolac epoxy resin, a typical plastic encapsulant, contains 0.9% to 1.6% hydroxyl (OH) groups. At elevated temperatures, these OH groups are activated and the plastic encapsulant 36, which is usually considered an insulator, becomes semi-insulating (i.e., electrically conductive at high resistance).

In a high-voltage semiconductor device, a semiconductor chip is normally packaged with the plastic encapsulant 36 and multiple pads (not shown) on the chip are usually electrically connected to multiple external terminals (not shown) via fine metal wirings (not shown). The 0 V that is the ground potential, 600 V that is the supply voltage, and the control signal are applied to the fine metal wirings, respectively. Accordingly, when the plastic encapsulant 36 becomes semi-insulating through the above-described action, an intermediate potential between 600 V and 0 V is presumed to be applied to the surface of the protective film 35. The intermediate potential is variable depending on the layout of the semiconductor chip in question. For example, where a grounding pad (not shown) is provided near the insulated-gate transistor on the chip, and a power-source pad (not shown) is provided in a position distant from the grounding pad, part of the plastic encapsulant 36 over the insulated-gate transistor might be at an intermediate potential of about 100 V. Taking such factors together and hypothesizing that during the high-temperature bias test the interface between the plastic encapsulant 36 and the protective film 35 on the semiconductor chip would have a potential of 100 V, the present inventors investigated what the potential distribution would be like in that situation.

The potential profile during the high-temperature bias test will be described in the following with reference to FIG. 21. FIG. 21 illustrates a posited potential profile during a high-temperature bias test in which the temperature was raised under the same bias voltage conditions as for the profile at room temperature, illustrated in FIG. 20. In FIG. 21, each dashed line indicates an equipotential line.

In the state shown in FIG. 21, the floating metal electrode 40 is accompanied not only by the parasitic capacitances C1 and C2, but also by another parasitic capacitance C5 formed between the floating metal electrode 40 and plastic encapsulant 36 (see FIG. 19). Likewise, the other floating metal electrode 41 is accompanied not only by the parasitic capacitances C3 and C4, but also by another parasitic capacitance C6 formed between the floating metal electrode 41 and plastic encapsulant 36. Accordingly, if the parasitic capacitance C5 or C6 has a value approximately equal to that of the sum of parasitic capacitances C1+C2 or C3+C4, then the plastic encapsulant 36 becomes semi-insulating during the high-temperature bias test. When the region of the plastic encapsulant 36 over the floating metal electrodes 40 and 41 comes to have a potential of 100 V, the potential of the floating metal electrode 41, which was about 450 V at room temperature, lowers to about 300 V due to the influence of the parasitic capacitance C6. In the same way, the potential of the floating metal electrode 40, which was about 150 V at room temperature, decreases to about 130 V owing to the influence of the parasitic capacitance C5. In response to this, the potential at the plate electrode 18b, which was about 300 V at room temperature, also decreases to 200 V. As a result, among the equipotential lines transecting the interface between the semiconductor region 2 and the oxide film 16, those that are 200 V or more bend toward the contact region 6, as indicated in FIG. 21, and thus the potential of the oxide film 16 side at the interface becomes negative with respect to the surface potential of the n-type semiconductor region 2.

Here, as far as the interface between the n-type semiconductor region 2 and oxide film 16 is concerned, it has been reported ("Reliability Technology for Semiconductor Devices," Japan Union of Scientists and Engineers Publishing Co.) that when in a high-temperature environment the potential on the oxide film 16 side becomes negative, the Si—H and Si—OH bonds in the interface are broken, creating positive fixed charges. When this sort of phenomenon occurs, giving rise to positive fixed charges in the interface between the semiconductor region 2 and the oxide film 16, negative mobile charges are also created in the oxide film 16. The negative mobile charges in the oxide film 16 are with the passage of time attracted little by little to the positive high potential of the metal electrode 25. As a result, the negative mobile charge density increases locally in a region of the oxide film 16 near the metal electrode 25, while the positive fixed charge density increases in the region where the negative mobile charges were originally created. Since a great number of negative charges exist in that region of the oxide film 16 over the interface and near the metal electrode 25, holes are attracted from the semiconductor region 2 toward that region. As a result, the surface of the n-type semiconductor region 2 changes into the opposite type, or p-type, thus forming a p-type inversion layer 43. Moreover, the region where the positive fixed charges remain attracts electrons from the semiconductor region 2, and thus the electron density increases locally in the area of the semiconductor region 2. As a result, an n-type accumulation layer 42 is formed near the surface of the semiconductor region 2.

Where the p-type inversion layer 43 and n-type accumulation layer 42 are formed in this way near the surface of the semiconductor region 2 as shown in FIG. 21, the electric field is locally concentrated where the p-type inversion layer 43 is near the contact region 6. It is assumed that over time, the breakdown voltage of the high-voltage semiconductor device deteriorates as a result.

Next, as a second conventional example, another known high-voltage semiconductor device will be described with reference to FIGS. 22 and 23. FIG. 22 illustrates in cross-section the chief components of a high-voltage semiconductor device according to the second conventional example. FIG. 23 illustrates parasitic capacitances in the structure illustrated in FIG. 22. It should be understood that regions in FIGS. 22 and 23 that are the same as in the first conventional example (FIG. 17) are assigned the same reference numerals, whose description will be omitted.

The device shown in FIG. 22 further includes p-type guard ring regions 44 and 45 that serve to increase its breakdown voltage. Unlike the device of the first conventional example shown in FIG. 17, the device of the second conventional example does not have the floating metal electrodes 40 and 41, but rather includes p-type guard ring regions 44 and 45 in the n-type semiconductor region 2.

In the conventional semiconductor device shown in FIG. 23, a parasitic capacitance C7 is present between the plate electrode 17b and guard ring region 44; a parasitic capacitance C8 is present between the guard ring region 44 and plate electrode 18b; a parasitic capacitance C9 is present between the plate electrode 18b and guard ring region 45; and a parasitic capacitance C10 is present between the guard ring region 45 and plate electrode 19b. A series circuit due to these parasitic capacitances C7 through C10 divides the voltage applied between the metal electrodes 25 and 33, establishing potentials in the guard ring regions 44 and 45, and plate electrode 18b. At least, this is in all likelihood the case at room temperature.

When the device with this structure is subjected to a high-temperature bias test as in the first conventional example, the plastic encapsulant 36 becomes semi-insulating. As a result, the surface of the protective film 35 comes to have an intermediate potential between 600 V and 0 V. If the intermediate potential were to be a low about 100 V, then the potential at the plate electrode 18b, which is about 300 V at room temperature, would lower to about 200 V, due to the existence of a parasitic capacitance C11 between the plastic encapsulant 36 and plate electrode 18b. In that case, the p-type inversion layer 43 occurs between the guard ring regions 44 and 45, making continuity between them. As a result, the breakdown voltage of the high-voltage semiconductor device is degraded.

SUMMARY OF THE INVENTION

It is therefore a principal object of the present invention to provide a superiorly reliable high-voltage semiconductor device in which deterioration in breakdown voltage does not occur even in high temperature applications.

A first inventive high-voltage semiconductor device includes: a semiconductor substrate whose conductivity is of a first type; a semiconductor region whose conductivity is of a second type, formed on the substrate; a doped contact region whose conductivity is of the second type, formed in the semiconductor region; a doped isolating region whose conductivity is of the first type, formed within the semiconductor region to be spaced apart from and surround the doped contact region; a field insulating film deposited over the semiconductor region where the region is located between the doped isolating and doped contact regions; a metal electrode electrically connected to the doped contact region; a plurality of plate electrodes electrically floating over the field insulating film, formed spaced apart from and, viewed normal to the substrate, surrounding the doped contact region; and an interlayer dielectric film formed over the field insulating film and the plurality of plate electrodes. In the device, a section of the metal electrode is extended onto the interlayer dielectric film where the film is located over an associated one of the plate electrodes and the section of the metal electrode is capacitively coupled with an associated one of the plate electrodes, and a CMOS circuit, and either a resistor, a capacitor, or both, are provided in the second-conductivity-type semiconductor region surrounded by the second-conductivity-type doped contact region.

In a preferable embodiment of the invention, being an inverter-control high-voltage semiconductor device including a high-voltage-end drive circuit, the high-voltage-end drive circuit includes the CMOS circuit, and either the resistor, the capacitor, or both.

In another preferable embodiment of the invention, the metal electrode includes as the extended section a plurality of portions and at least one of the portions is narrower in width than the plate electrodes where the plate electrodes are capacitively coupled to the metal electrode.

In still another preferable embodiment of the invention, the metal electrode includes a portion covering, via the interlayer dielectric film, the entire upper surface of that plate electrode among the plurality of plate electrodes that is located nearest the doped contact region.

In yet another preferable embodiment of the invention, the metal electrode includes as the extended section a plurality of portions and the more distant from the doped contact region each of the portions of the extended section is, the narrower its width becomes.

In yet another preferable embodiment of the invention, a plurality of guard-ring regions whose conductivity is of the first type is formed in the upper portion of the semiconductor region where the region is located under an associated one of the plate electrodes.

In yet another preferable embodiment of the invention, a buried region whose conductivity is of the second type is formed in a location corresponding to a circuit element region for a high-voltage-end drive circuit between the first-conductivity-type semiconductor substrate and the second-conductivity-type semiconductor region.

A second inventive high-voltage semiconductor device includes: a semiconductor substrate whose conductivity is of a first type; an insulating layer formed on the substrate; a semiconductor region whose conductivity is of a second type, disposed over the insulating layer; a doped contact region whose conductivity is of the second type, formed in the semiconductor region; an isolating region formed within the semiconductor region to be spaced apart from and surround the doped contact region; a field insulating film deposited over the semiconductor region where the region is located between the isolating region and the doped contact region; a metal electrode electrically connected to the doped contact region; a plurality of plate electrodes electrically floating over the field insulating film, formed spaced apart from and, viewed normal to the substrate, surrounding the doped contact region; and an interlayer dielectric film formed over the field insulating film and the plurality of plate electrodes. In the device, a section of the metal electrode is extended onto the interlayer dielectric film where the film is located over an associated one of the plate electrodes and the section of the metal electrode is capacitively coupled with an associated one of the plate electrodes, and a CMOS circuit, and either a resistor, a capacitor, or both, are provided in the second-conductivity-type semiconductor region surrounded by the second-conductivity-type doped contact region.

In a preferable embodiment of the present invention, being an inverter-control high-voltage semiconductor device including a high-voltage-end drive circuit, the high-voltage-end drive circuit includes the CMOS circuit, and either the resistor, the capacitor, or both.

In another preferable embodiment of the invention, the metal electrode includes as the extended section a plurality of loop-shaped metal electrode portions and at least one of the loop-shaped metal electrode portions is narrower in width than the plate electrodes where the plate electrodes are capacitively coupled to the loop-shaped metal electrodes.

In still another preferable embodiment of the invention, the metal electrode includes a portion covering, via the interlayer dielectric film, the entire upper surface of that plate electrode among the plurality of plate electrodes that is located nearest the doped contact region.

In yet another preferable embodiment of the invention, the metal electrode includes as the extended section a plurality of loop-shaped metal electrode portions and the more distant from the doped contact region each of the loop-shaped metal electrode portions is, the narrower its width becomes.

In yet another preferable embodiment of the invention, a plurality of guard-ring regions whose conductivity is of the first type is formed in the upper portion of the semiconductor region where the region is located under an associated one of the plate electrodes.

A third inventive high-voltage semiconductor device includes: a semiconductor substrate whose conductivity is of a first type; a semiconductor region whose conductivity is of a second type, formed on the substrate; a doped contact region whose conductivity is of the second type, formed in the semiconductor region; a field insulating film deposited over the semiconductor region; a metal electrode electrically connected to the doped contact region; a plurality of plate electrodes electrically floating over the field insulating film, formed spaced apart from and, viewed normal to the substrate, surrounding the doped contact region; and an interlayer dielectric film formed over the field insulating film and the plurality of plate electrodes. In the device, a section of the metal electrode is extended onto the interlayer dielectric film where the film is located over an associated one of the plate electrodes and the section of the metal electrode is capacitively coupled with an associated one of the plate electrodes, and a CMOS circuit, and either a resistor, a capacitor, or both, are provided in the second-conductivity-type semiconductor region surrounded by the second-conductivity-type doped contact region.

In a preferred embodiment of the present invention, the inventive device further includes: a surface protective film formed over the metal electrode and the interlayer dielectric film; and a plastic encapsulant formed over the surface protective film.

In another preferred embodiment of the invention, the surface protective film is a multi-layered film including an upper layer made of a polyimide resin and an insulating layer made of an inorganic material as a lower layer.

In the inventive high-voltage semiconductor device, portions of the metal electrode are extended onto the interlayer dielectric film and are located over the electrically floating plate electrodes formed on the field insulating film. And those portions of the metal electrode are capacitively coupled to the plate electrodes. Accordingly, this lets the difference between potentials at the part of the semiconductor region under each plate electrode, and at the metal electrode which is formed on the interlayer dielectric film deposited over the plate electrode, be divided by a capacitor series circuit formed by these coupling capacitances, so that an appropriate bias voltage is applied to the floating plate electrode. Thus, a p-type inversion layer, which often appears under the surface of the semiconductor region, may be essentially eliminated. As a result, the breakdown voltage of the device including either a resistor, a capacitor, or both may be kept high even at elevated temperatures. Accordingly, a high-voltage semiconductor device having high reliability may be obtained.

Covering entirely that one of the plurality of plate electrodes that is at the highest potential level with the metal electrode, via the interlayer dielectric film, enables potentials to be applied stably to the underlying semiconductor region even if the protective film has partially lost its insulation properties due to stress. As a result, deterioration in breakdown voltage is avoidable not only at elevated temperatures, but also where the protective film has partially lost its insulation properties.

DESCRIPTION OF THE PREFERRED EMBODIMENTS

Figure 1:
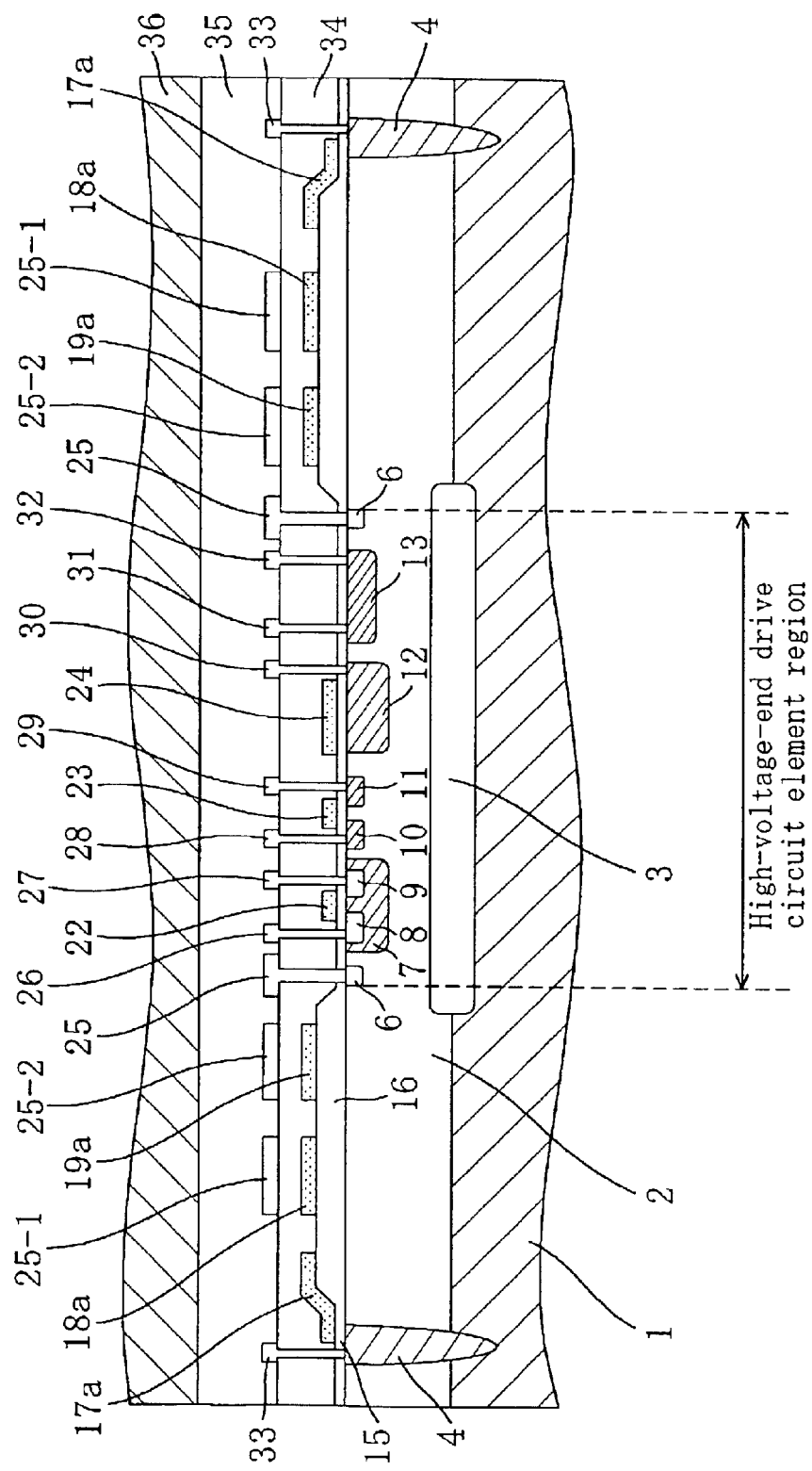
FIG. 1 is a cross-sectional view illustrating a structure for a main part of a high-voltage semiconductor device according to a first embodiment of the present invention.

Hereinafter, preferred embodiments of the present invention will be described with reference to the accompanying drawings, in which components with substantially same functions are identified by the same reference numeral for the sake of simplicity. The following description of the present invention will be focused on a semiconductor device with a high breakdown voltage of 100 V or more (e.g., in the range from 500 V to 800 V). It should be noted, however, that the present invention is in no way limited to the following illustrative embodiments.

Embodiment 1

A high-voltage semiconductor device according to a first embodiment of the present invention will be described with reference to FIGS. 1 through 3.

FIG. 1 schematically illustrates a cross-sectional structure of the device of the first embodiment. FIG. 2 schematically illustrates a planar layout of a structure of the device. FIG. 2 illustrates only a polysilicon plate electrode, a metal electrode and an n-type doped contact region to make the structure easily understandable.

As shown in FIG. 1, in the high-voltage semiconductor device, plate electrodes 18a and 19a are capacitively coupled (capacitively inter-coupled) to extended portions 25-1 and 25-2 of a metal electrode 25, respectively, through an interlayer dielectric film 34 over the plate electrodes, thereby preventing the breakdown voltage of the device from decreasing at an elevated temperature. It will be described later how the breakdown voltage of the device can be prevented from decreasing at an elevated temperature. The high-voltage semiconductor device of this embodiment is fabricated by a pn junction isolation technique. In the device, a high-voltage-end drive circuit including a CMOS circuit (CMOS transistor) and either a resistor, or a capacitor, or both is formed in a high-voltage-end drive circuit region located in the inner part (the approximately center part) surrounded with the plate electrodes 18a and 19a and the extended portions 25-1 and 25-2 of the metal electrode 25. As shown in FIG. 2, the high-voltage-end drive circuit in the high-voltage-end drive circuit element region can be controlled by a high voltage control signal via a metal wiring 49. The high-voltage-end drive circuit can make up an inverter control system when combined with a low-voltage-end drive circuit. The inverter control system including the high-voltage-end drive circuit can be used for various applications of inverter control circuits including illumination, PDP and motor circuits.

Figure 16:
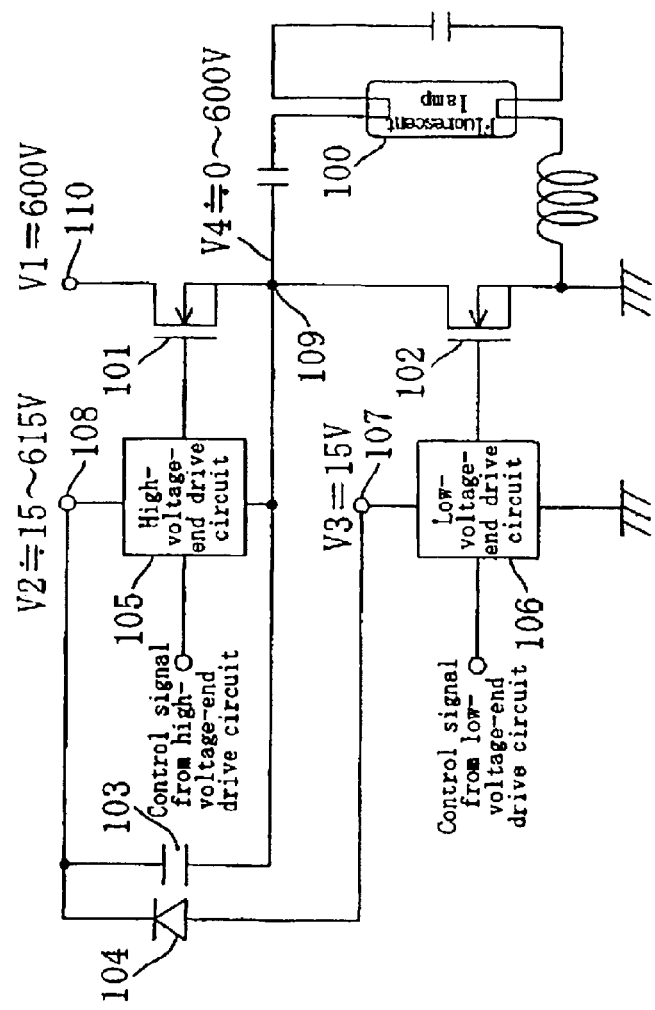
FIG. 16 is a block diagram illustrating a structure of an inverter control system for illumination as an exemplary inverter control system.
Figure 17:
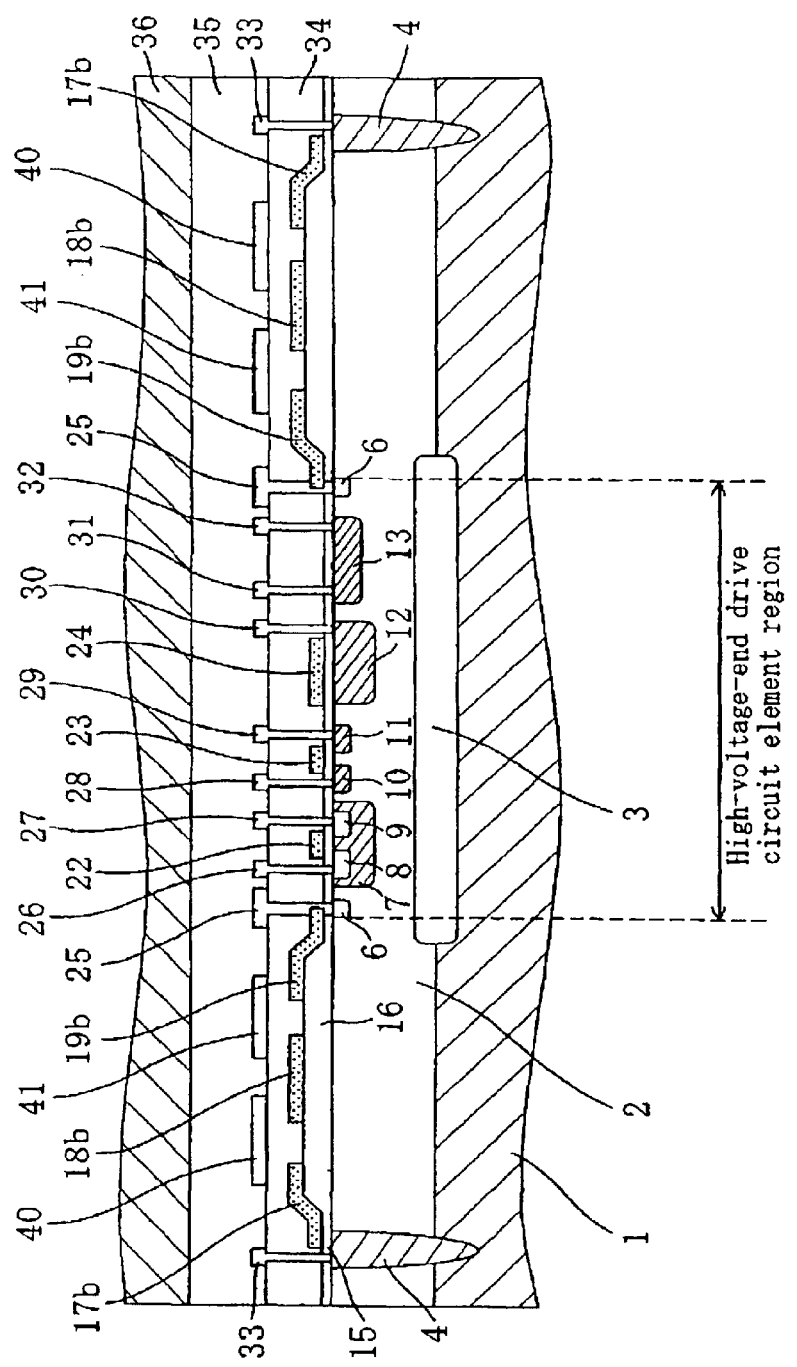
FIG. 17 is a cross-sectional view illustrating a structure for a high-voltage semiconductor device according to a first conventional example.
Figure 18:
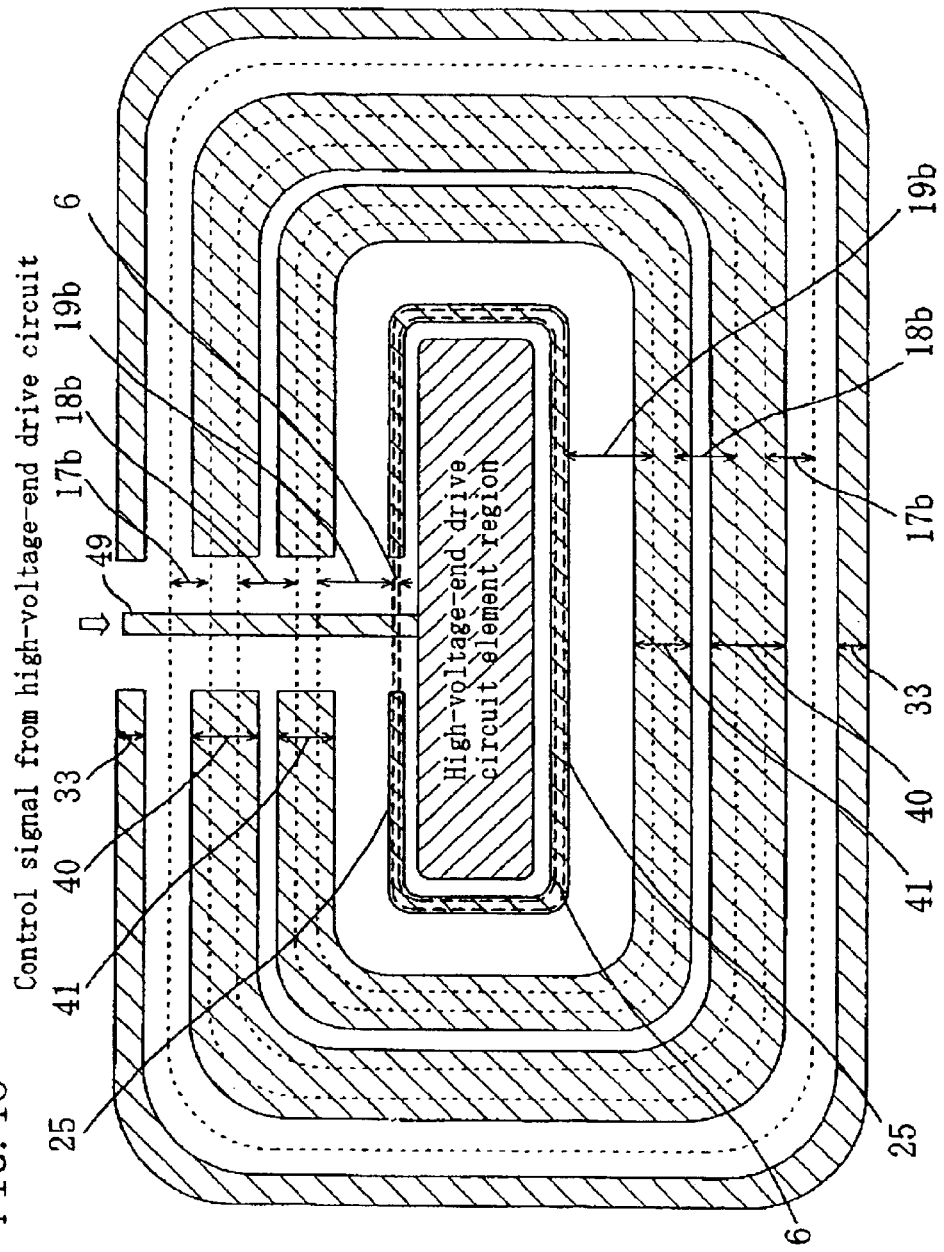
FIG. 18 is a plan view schematically illustrating a cross-sectional structure for the device of the first conventional example.
Figure 19:
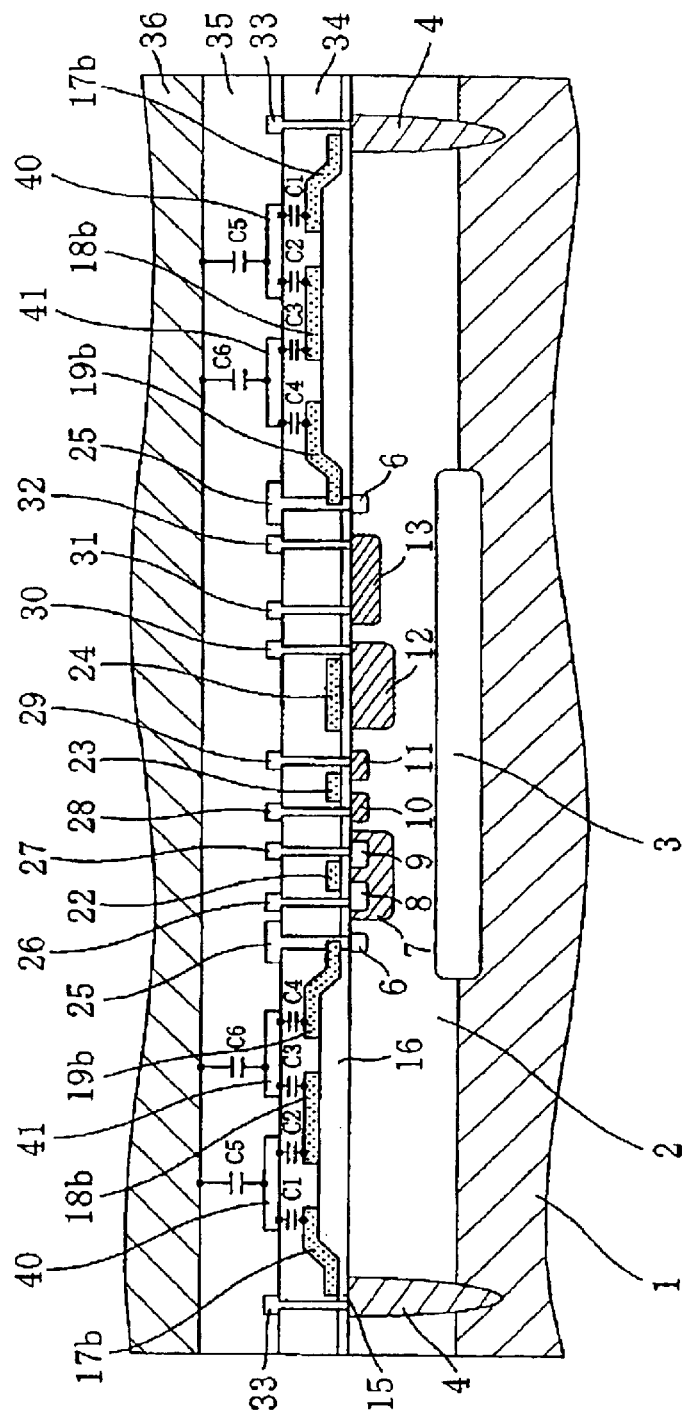
FIG. 19 is a cross-sectional view illustrating parasitic capacitances in the device of the first conventional example.
Figure 20:
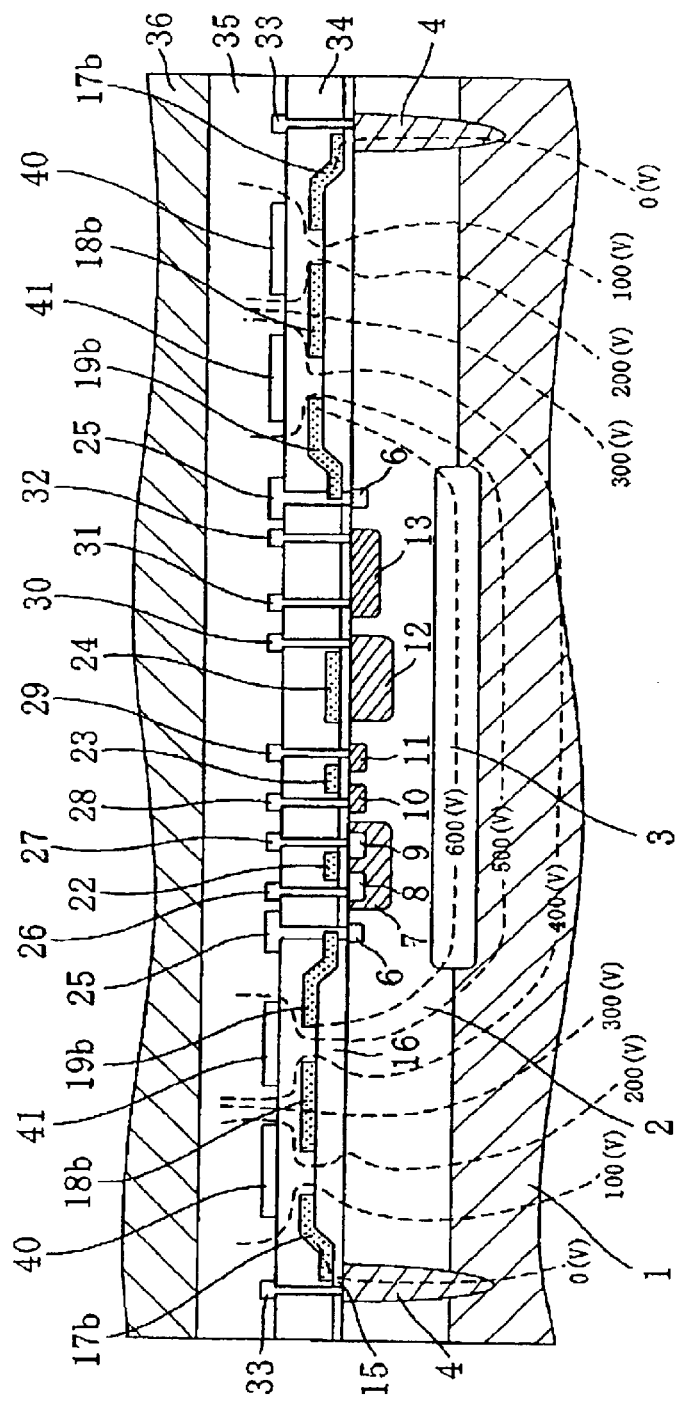
FIG. 20 is a cross-sectional view illustrating potential profiles at room temperature in the device of the first conventional example.

It should be noted that, according to this embodiment, the low-voltage-end drive circuit (106 in FIG. 16) of the inverter control system is formed in the region located outside of a metal wiring 33 for pn junction isolation and the high-voltage-end drive circuit, and the low-voltage-end drive circuit and the low-voltage-end drive circuit are formed in a one-chip IC. The high-voltage-end drive circuit and the low-voltage-end drive circuit, however, are not limited to the above structure but may be separately formed.

The structure of the high-voltage semiconductor device of the first embodiment will be further described. The device of this embodiment includes a p-type semiconductor substrate 1 and an n-type semiconductor region 2 which is defined in the substrate 1 by lightly doping an n-type dopant thereto. In other word, in this embodiment, the semiconductor region 2 is formed in the upper portion of the substrate 1, the portion having the surface of the substrate. An n-type doped contact region 6 is defined approximately at the center of the surface of the semiconductor region 2 by heavily doping an n-type dopant thereto and an n-type doped buried region 3 is formed at the center of the interface between the semiconductor substrate 1 and the semiconductor region 2. A p-type doped isolating region 4 is formed within the semiconductor region 2 to be spaced apart from, and surround the contact region 6 by doping a p-type dopant to the semiconductor region 2. In part of the semiconductor region 2, surrounded with the contact region 6, the high-voltage-end drive circuit elements, such as a CMOS, a capacitor and a resistor, are located.

A thin oxide film 15 is deposited over the isolating region 4. A plate electrode 17a is formed out of doped polysilicon on the oxide film 15. A thick oxide film 16 has been deposited as a field insulating film over part of the semiconductor region 2 between the isolating and contact regions 4 and 6. The oxide film 16 will be herein referred to as a "field oxide film" for convenience sake. Multiple plate electrodes 18a and 19a are formed on the field oxide film 16 so as to be spaced apart from the contact region 6. When the device is viewed normal to the substrate, the plate electrodes 18a and 19a surround the contact region 6. The electrodes 18a and 19a are both electrically floating and both made of doped polysilicon. The oxide films 15 and 16 and electrodes 17a, 18a and 19a are covered with interlayer dielectric film 34, which is made of an oxide film or nitride film, for example.

The isolating region 4 and the contact region 6 are electrically connected to an isolating metal electrode 33 and an metal electrode 25, respectively. Sections 25-1 and 25-2 of the metal electrode 25 are extended onto the interlayer dielectric film 34 and are provided over the plate electrodes 18a and 19a, respectively. Each of the extended sections 25-1 and 25-2 is capacitively coupled to the respective one of the plate electrodes 18a and 19a.

The extended sections 25-1 and 25-2 are electrically connected to the contact region 6 through a linkage 25-3 and the body of the metal electrode 25. Furthermore, a protective film 35 is deposited on the interlayer dielectric film 34 to cover the metal electrodes 26 thorough 33 and 25-1, 25-2 and 25-3. And a plastic encapsulant 36 is formed on the protective film 35 to mold the components of the device.

The surface protective film 35 of this embodiment is formed of, for example, silicate glass, silicon nitride, or a polyimide resin. The surface protective layer 35 may be formed of a combination thereof or a laminated film. If the surface protective film 35 is constituted by a laminated film, it is preferable to form an insulating layer made of a polyimide resin as the upper layer. In this case, an insulating layer made of an inorganic material (e.g., silicate glass layer, silicon nitride layer) is formed as the lower layer. Examples of polyimide resin include polyamide imide resin, and polyamic acid resin (precursor of polyimide resin), in addition to polyimide. The plastic encapsulant 36 of this embodiment is formed of, for example, novolak epoxy resin or the like.

The polyimide resin retains high insulation properties even at high temperatures (150° C.), unlike novolak epoxy resin, so that it can be used for a reliable organic insulating film. Compared to an inorganic insulating film that is formed by CVD, the polyimide resin has an advantage in that its thickness can be easily controlled. For example, the thickness can be easily increased by increasing the viscosity of a precursor of the polyimide resin, or applying the precursor twice. Therefore, the surface protective film 35 is made of a polyimide resin layer or a multi-layered film including a polyimide resin layer as the uppermostlayer, the thickness of the surface protective film can be easily controlled. When the thickness of the surface protective film 35 is large, the capacitive coupling between the plate electrodes 18a and 19a and the plastic encapsulant 36 can be small, so that the effect of preventing breakdown voltage degradation at high temperatures can be enhanced.

The semiconductor region 2 of this embodiment is defined by lightly doping an n-type dopant to the substrate. Around the interface between the p-type semiconductor substrate 1 and the n-type semiconductor region 2, an n-type doped buried region 3 exists. The existence of the n-typed doped buried region 3 allows a breakdown phenomenon to occur at the pn junction locally created between the n-type local buried region 3 and p-type substrate 1. Then, a voltage, applied to the drain of the insulated-gate transistor, can be limited and the breakdown voltage can be increased against static electricity, power surge or surge caused by lightning. When a depletion layer originating from the pn junction between the p-type semiconductor substrate 1 and n-type semiconductor region 2 and expanding radially into the semiconductor region 2 reaches a p-type doped layer (e.g., 7, 12 or 13) constituting the high-voltage-end drive circuit, a current leakage from the p-type doped layer to the p-type semiconductor substrate 1 normally occurs due to a so-called punch through phenomenon. The n-type doped buried region 3, however, plays a role in preventing such an unwanted current leakage.

The structure including the n-type doped buried region 3 has been described in the first embodiment. However, the n-type doped buried region 3 is not necessarily provided. In the structure without the n-type doped buried region 3, an n-type epitaxial layer may be formed on the p-type semiconductor substrate 1 or an n-type well may be selectively formed in the p-type semiconductor substrate 1 so as to be used as the semiconductor region 2. Where the n-type well is used as the semiconductor region 2, a CMOS, a capacitor and resistance may be formed in the semiconductor region that is the n-type well without forming the isolating region (doped isolating region) 4.

In the structure in which an n-type layer has been epitaxially grown on the p-type semiconductor substrate 1, the n-type epitaxial layer can be relatively thick so that a depletion layer originating from the pn junction between the p-type semiconductor substrate 1 and n-typed epitaxial layer and expanding into the n-type epitaxial layer does not reach the p-type doped layer (e.g., 7, 12 or 13). Where the n-type well is selectively formed in the p-type semiconductor substrate 1, the well may be relatively deep so that a depletion layer originating from the pn junction between the p-type semiconductor substrate 1 and n-typed well and expanding radially into the n-type well does not reach the p-type doped layer (e.g., 7, 12 or 13).

The "breakdown voltage" described in the foregoing mainly concerns the initial breakdown voltage of the high-voltage semiconductor device. Hereinafter, how the initial breakdown voltage of the device can be kept sufficiently high even during the high-temperature bias test will be described.

Figure 3:
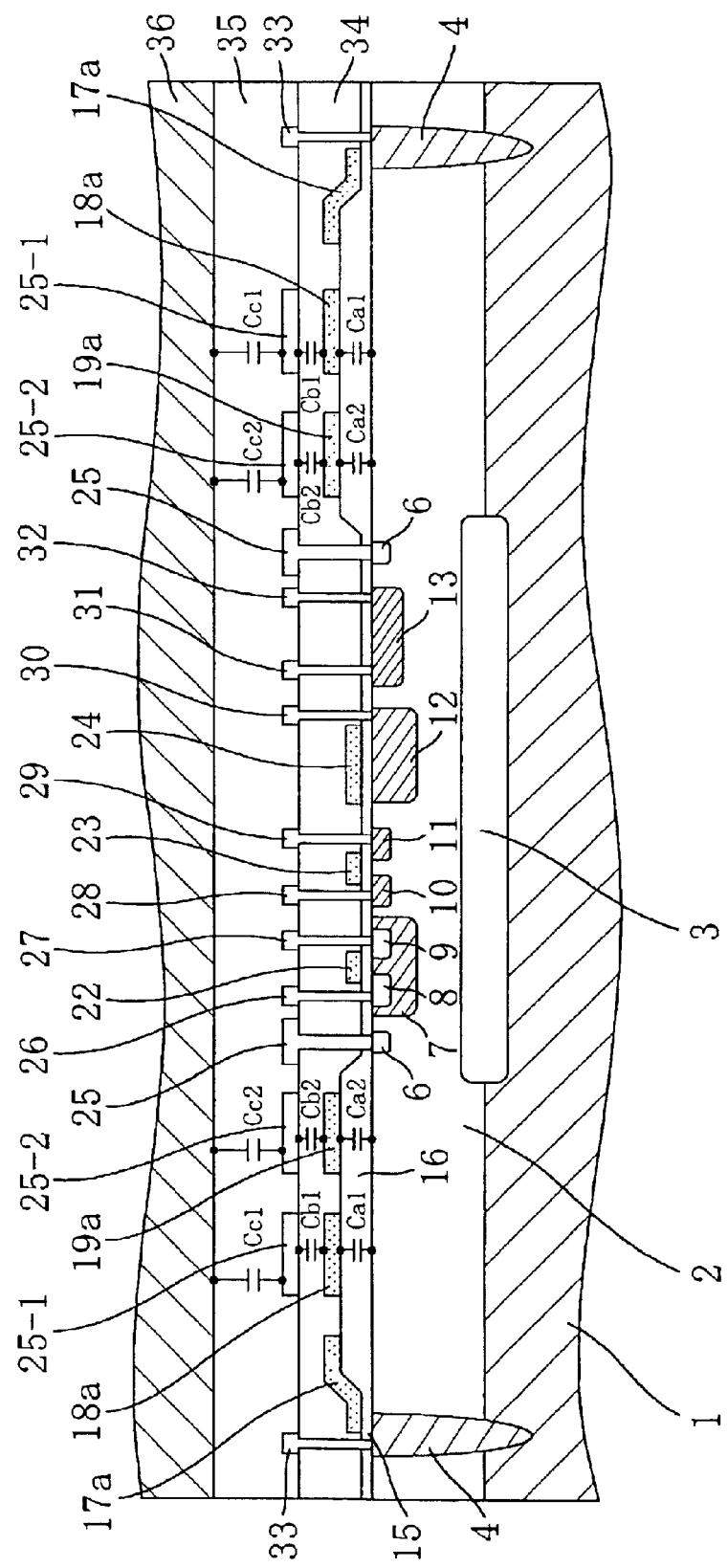
FIG. 3 is a cross-sectional view illustrating parasitic capacitances in the device of the first embodiment.

As shown in FIG. 3, a parasitic capacitance Ca1 exists between the plate electrode 18a and semiconductor region 2. A parasitic capacitance Ca2 exists between the plate electrode 19a and semiconductor region 2. A parasitic capacitance Cb1 exists between the plate and metal electrodes 18a and 25-1. A parasitic capacitance Cb2 exists between the plate and metal electrodes 19a and 25-2. A parasitic capacitance Cc1 exists between the metal electrode 25-1 and plastic encapsulant 36. And a parasitic capacitance Cc2 exists between the metal electrode 25-2 and plastic encapsulant 36. In this case, V2=600 V equal to that applied to the metal electrode 25 is also applied to the extended metal electrodes 25-1 and 25-2. Accordingly, the parasitic capacitances Cc1 and Cc2 do not affect the plate electrodes 18a and 19a. Thus, herein, the effects of the other parasitic capacitances Ca1, Ca2, Cb1 and Cb2 need to be considered.

The potential at the plate electrode 18a is herein supposed to be obtained by dividing the difference between the potential in part of the semiconductor region 2 directly under the electrode 18a and the voltage of V2=600 V applied to the metal electrode 25 by a series circuit consisting of Ca1 and Cb1. The potential at the plate electrode 19a is herein supposed to be obtained by dividing the difference between the potential in part of the semiconductor region 2 directly under the electrode 19a and the voltage of 600 V applied to the metal electrode 25 by a series circuit consisting of Ca2 and Cb2. On this supposition, a further description will be given.

In the high-voltage semiconductor device of this embodiment, for parts of the region between the isolating and contact regions 4 and 6 which have no n-type doped buried region 3, an initial breakdown voltage is maintained by using a so-called "re-surf" technique. Hereinafter, its operating principle will be described.

Normally, as the isolating region 4 and the semiconductor substrate 1 are kept at 0 V, the voltage V2 for driving the high-voltage-end drive circuit is applied to the metal electrode 25. As the voltage V2 is gradually increased from 0 V, while the voltage V2 is still relatively low, a depletion layer, originating from the pn junction between the p-type isolating region 4 and n-type semiconductor region 2, expands laterally from the isolating region 4 into the semiconductor region 2 toward the contact region 6. At the same time, another depletion layer expands upward from the pn junction between the n-type semiconductor region 2 and p-type semiconductor substrate 1.

When the voltage V2 is further increased, the part of the n-type semiconductor substrate 2 which has no n-type doped buried region 3 will be filled with the depletion layer to reach a so-called completely depleted state. In such a state, a concentration of electric field generated due to the shape of the depletion layer is reduced, and thus potential profiles become equilibrium. Accordingly, the breakdown voltage is increased. A technique of maintaining a breakdown voltage for a semiconductor device by filling the semiconductor region with the depletion layer from the pn junctions so as to reduce electric fields in this manner is called "re-surf technique" in the art. According to this technique, where the semiconductor region is formed relatively long in a lateral direction, the potential difference per unit of distance decreases and thus electric intensity also decreases. Accordingly, improved high breakdown voltage properties can be achieved.

Figure 2:
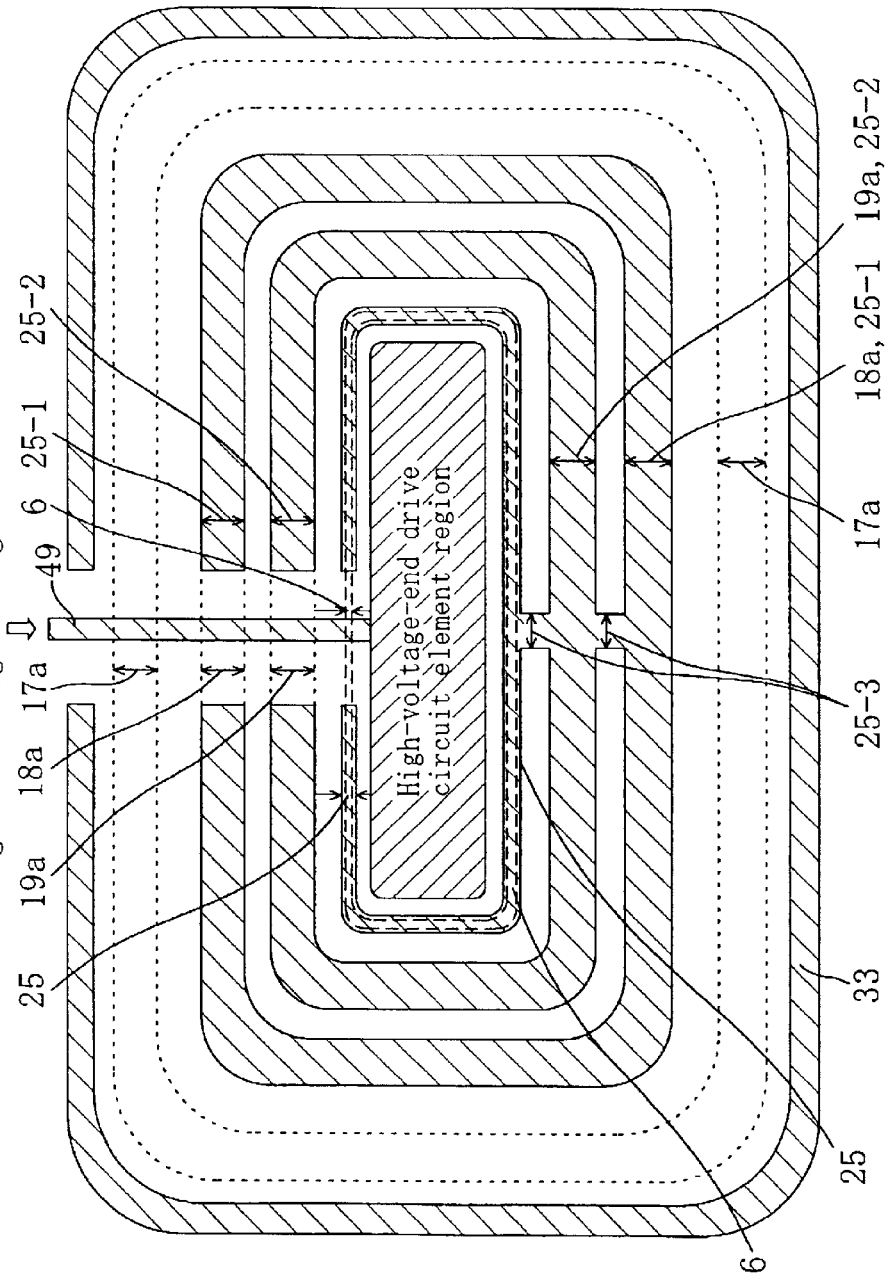
FIG. 2 is a plan view illustrating a structure for a main part of the device of the first embodiment.

The device shown in FIGS. 1, 2 and 3 has been designed to have a sufficiently high breakdown voltage. Specifically, the distance between the isolating and contact regions 4 and 6 is long enough to prevent parts of the semiconductor region 2 near the contact region 6 of FIG. 1 from being depleted even if the voltage of V2=600 V is applied to the metal electrode 25. In this structure, the potential at a given position in the depletion layer changes depending on how distant from the pn junction the position is. On the other hand, non-depleted regions are at the same potential level.

As has been understood, in the structure shown in FIGS. 1, 2 and 3, the part of the semiconductor region 2, which is located directly under the plate electrode 19a and is closest to the contact region 6, has a potential somewhat lower than the drain voltage, e.g., about 500 V. Another part of the semiconductor region 2, located directly under the plate electrode 18a and closer to the isolating region 4 rather than a midpoint between the isolating and contact regions 4 and 6 is, has a potential lower than half of the voltage V2 of 600 V, which has been applied thereto, e.g., about 240 V.

Figure 4:
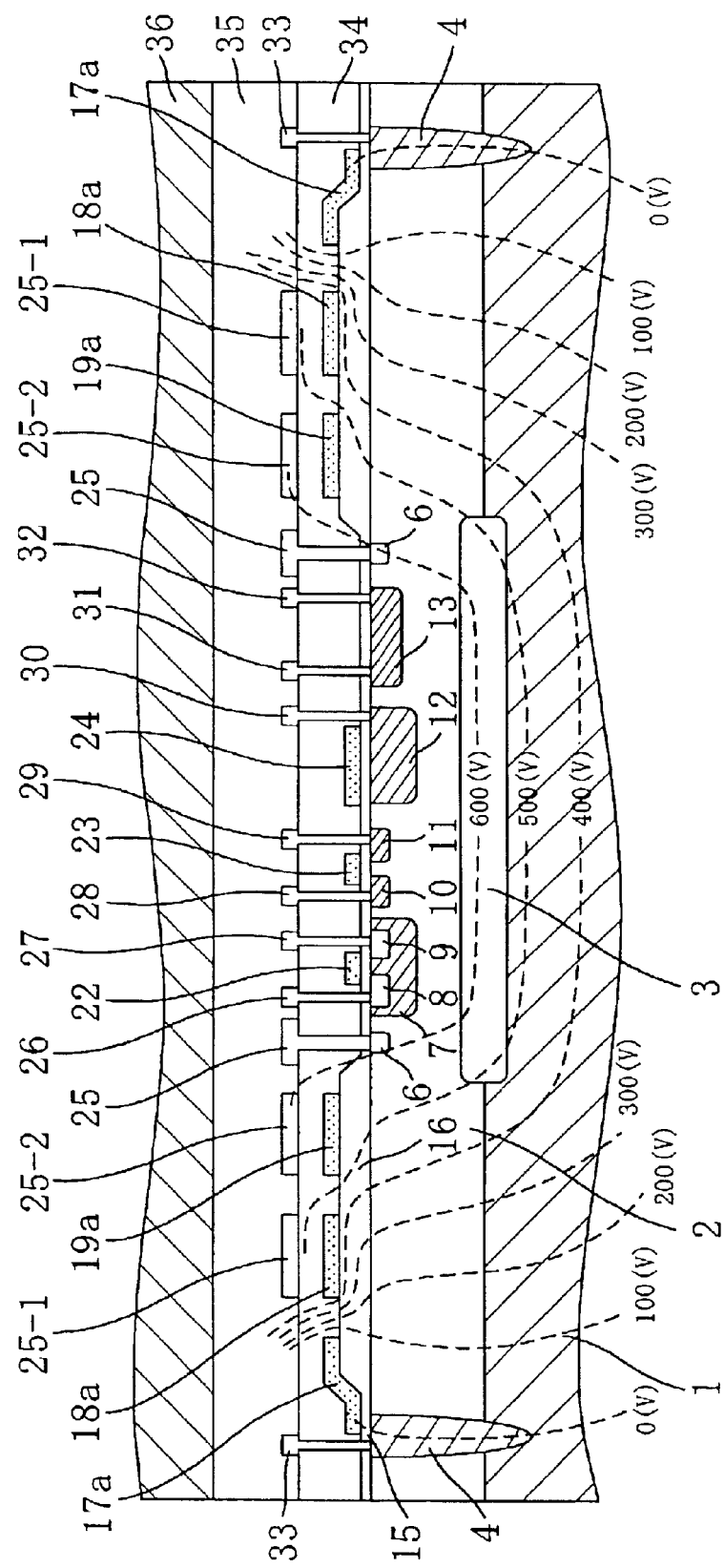
FIG. 4 is a cross-sectional view illustrating potential profiles in the device of the first embodiment.

The potential at the plate electrode 18a can be obtained by dividing the difference between the potential (about 240 V) in that part of the semiconductor region 2 directly under the plate electrode 18a and the voltage of 600 V applied to the metal electrode 25-1 by the series circuit of Ca1 and Cb1. In the illustrated example, the potential at the plate electrode 18a is about 420 V (=(240+600)/2). The potential at the plate electrode 19a can be obtained by dividing the difference between the potential (about 500 V) in that part of the semiconductor region 2 directly under the plate electrode 19a and the voltage of 600 V applied to the metal electrode 25-2 by the series circuit of Ca2 and Cb2. In the illustrated example, the potential at the plate electrode 19a is about 550 V (=(500+600)/2). FIG. 4 schematically illustrates potential profiles that were obtained under the same conditions. Specifically, the potential profiles shown in FIG. 4, which are represented by dashed equipotential lines for 0, 100, 200, 300, 400, 500 and 600 V, were obtained with the voltage of 600 V applied to the metal electrode 25. It should be noted that the potential profiles shown in FIG. 4 and results of simulations carried out by the present inventors showed similar tendencies.

Figure 21:
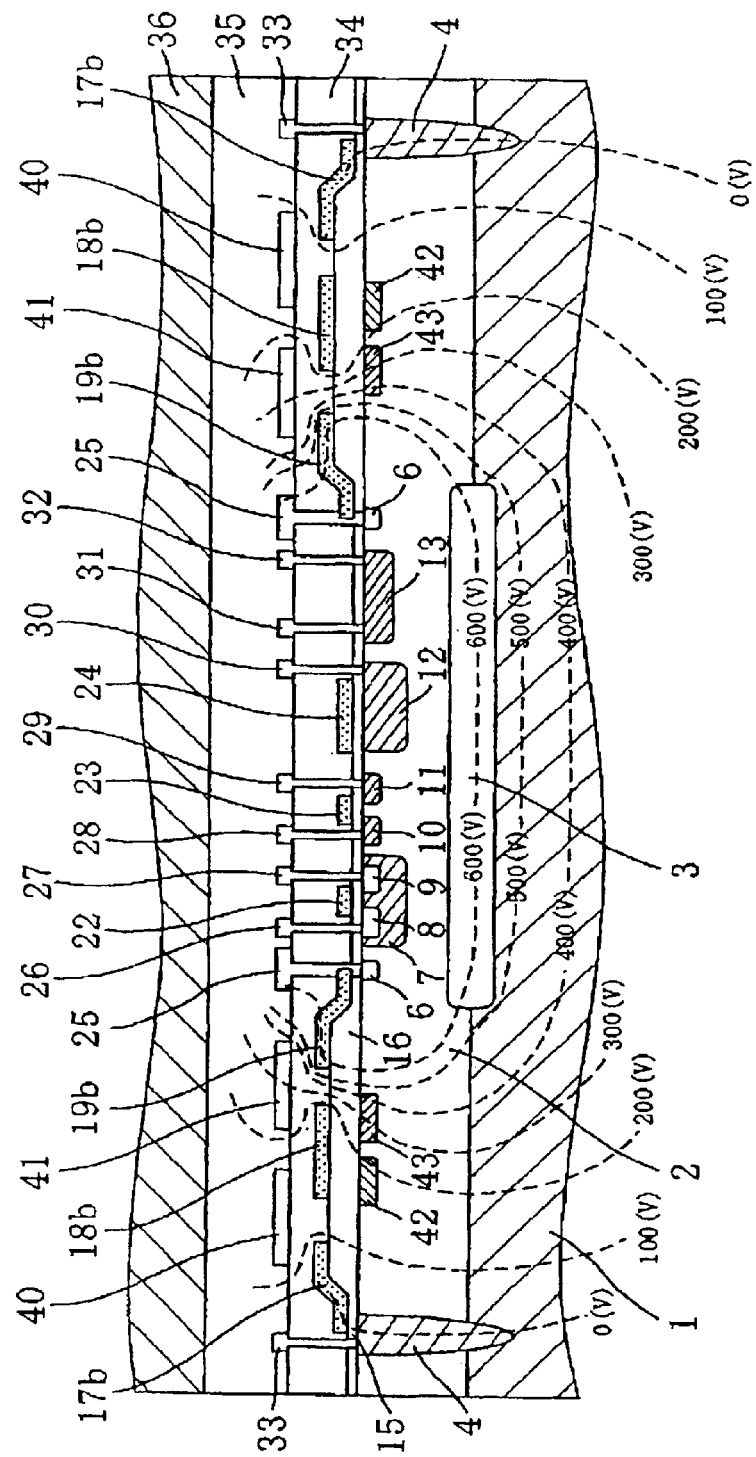
FIG. 21 is a cross-sectional view illustrating how the breakdown voltage of the device of the first conventional example decreases during a high-temperature bias test.
Figure 22:
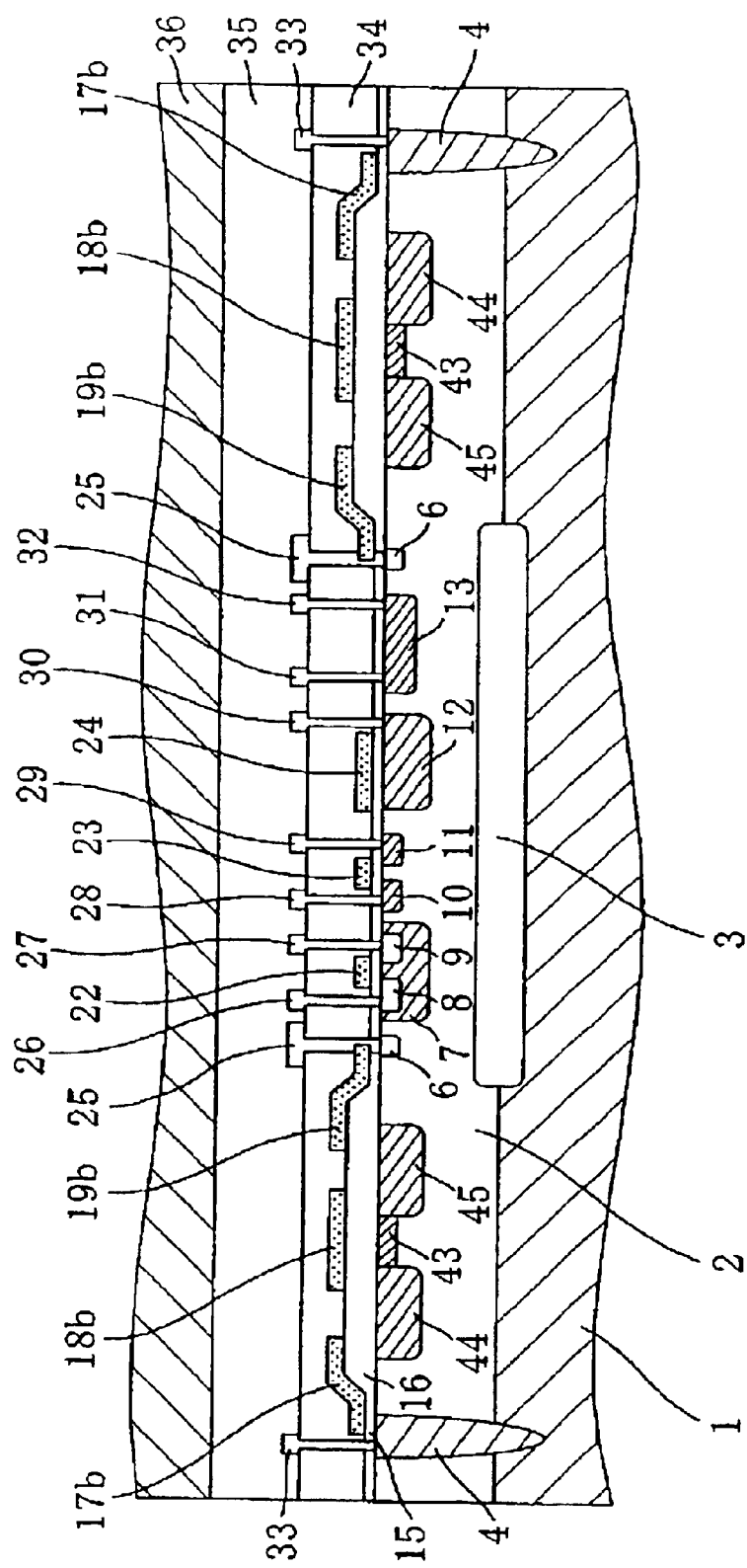
FIG. 22 is a cross-sectional view illustrating how the breakdown voltage of a high-voltage semiconductor device according to a second conventional example decreases.
Figure 23:
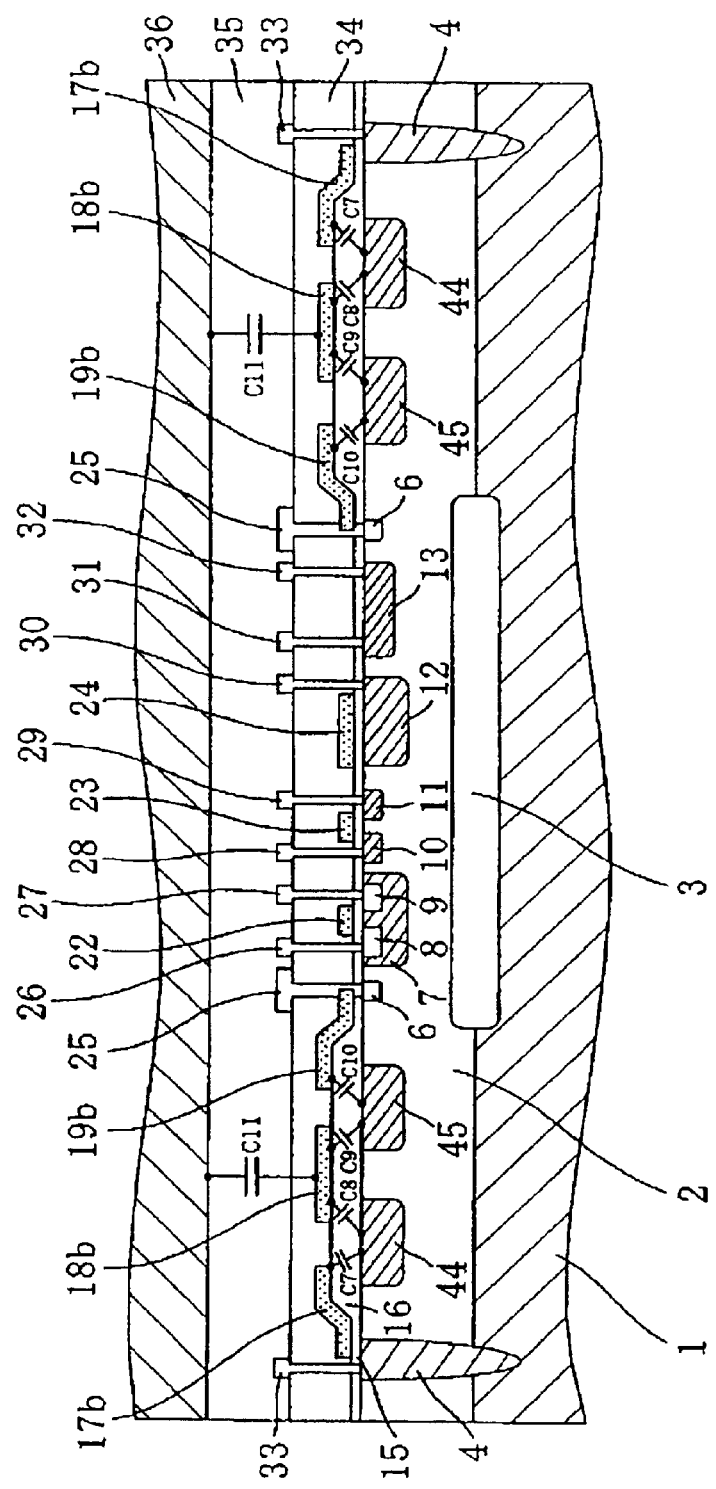
FIG. 23 is a cross-sectional view illustrating how the parasitic capacitances in the device of the second conventional example decreases.

As shown in FIG. 21, in the structure of the known device, when the device is operated at an elevated ambient temperature of 150° C. with a high voltage of 500 V or more (e.g., 600 V) applied to the metal electrode 25, the breakdown voltage (the breakdown voltage between the terminal 108 in FIG. 16 to which the voltage V2 is applied and the ground potential GND) between the metal electrodes 25 and 33 decreases.

In the high-voltage semiconductor device of this embodiment, even when the device is operated at an elevated ambient temperature of 150° C. with a high voltage of 500 V or more (e.g., 600 V) applied to the metal electrode 25, the potential profiles shown in FIG. 4 are maintained and thus the breakdown voltage between the metal electrodes 25 and 33 does not decrease. The following is the reason for this phenomenon. In this embodiment, the sections 25-1 and 25-2 of the metal electrode 25 are extended onto the interlayer dielectric film 34 and located directly over the plate electrodes 18a and 19a, respectively, so that the plate electrodes 18a and 19a are capacitively coupled to the extended sections 25-1 and 25-2. Therefore, the potential at the electrode 18a or 19a is hardly affected by the protective film 35 and the layers over the protective film 35.

As can be seen from FIG. 4, around the interface between the field oxide film 16 and semiconductor region 2, the oxide film 16 is at a higher potential level than almost all the semiconductor region 2. Accordingly, even if a high-temperature bias test is carried out on this device, no negative mobile charges is created unlike the conventional example. For that reason, no p-type inversion layer is formed under the interface. Thus, there is no concern about the decrease in initial breakdown voltage even during the high-temperature bias test.

In other words, the sections 25-1 and 25-2 of the metal electrode 25 are extended onto the interlayer dielectric film 34 and located over the plate electrodes 18a and 19a, respectively, so that the electrodes 18a and 19a are capacitively coupled to the extended sections 25-1 and 25-2. Accordingly, a potential at the electrode 18a or 19a can be obtained by having the potential difference divided by a series circuit consisting of a parasitic capacitance between the electrode 18a or 19a and extended section 25-1 or 25-2 and a parasitic capacitance between the electrode 18a or 19a and part of the semiconductor region 2 directly under the electrode 18a or 19a. That is to say, the potential at the electrode 18a or 19a is hardly affected by the protective film 35 and other upper layers. Thus, a potential higher than that in the semiconductor region 2 can be applied stably to the electrically floating plate electrode 18a or 19a. As a result, it is possible to achieve a high-breakdown-voltage semiconductor device in which even if this device is subjected to the high-temperature bias test, the breakdown voltage (the breakdown voltage between the terminal 108 in FIG. 16 to which the voltage V2 is applied and the ground potential GND) between the metal electrodes 25 and 33 does not decrease.

In the illustrated embodiment, the widths of the plate electrodes 18a and 19a are set equal to those of the extended metal electrodes 25-1 and 25-2, respectively. In this structure, the series circuit of Ca1 and Cb1 divides the potential difference almost by two. Thus, the potential difference between the plate electrode 18a and the underlying part of the semiconductor region 2 is about 180 V As the case may be, the potential difference might be so great that the electric field could be concentrated excessively around the end of the plate electrode 18a closer to the plate electrode 17a. In that case, the initial breakdown voltage could not be sufficient high. To avoid this unwanted phenomenon by reducing the potential difference between the plate electrode and semiconductor region, the device of the first embodiment may be modified as will be described next for the second embodiment of the present invention.

Embodiment 2

Hereinafter, a high-voltage semiconductor device according to the second embodiment will be described with reference to FIG. 5.

Figure 5:
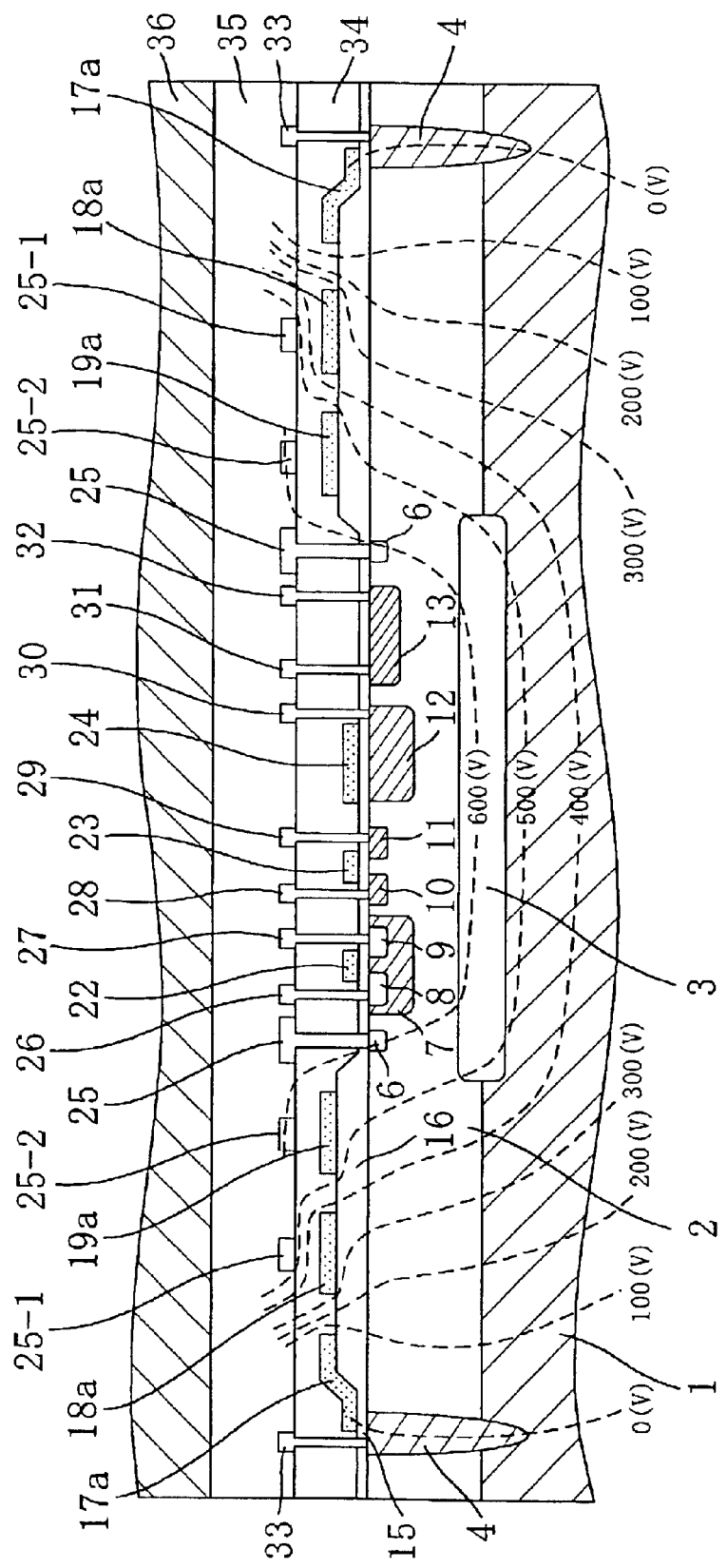
FIG. 5 is a cross-sectional view illustrating a structure for a main part of a high-voltage semiconductor device according to a second embodiment of the present invention and potential profiles in the device.

FIG. 5 schematically illustrates a cross-sectional structure for the device of the second embodiment. In the second embodiment, the widths of the extended section 25-1 and 25-2 of the metal electrode 25 are half of the widths of the plate electrodes 18a and 19a.

Suppose the operating conditions for the device of the second embodiment are the same as those for the device of the first embodiment. Then, the potential difference (about 120 V) between the electrode 18a and semiconductor region 2 can be obtained by dividing the difference between the potential (about 240 V) in part of the semiconductor region 2 under the electrode 18a and the voltage (about 600 V) applied to the electrode 25-1 by the series circuit Ca1+Cb1. Thus, the potential at the electrode 18a is about 360 V. The potential at the electrode 19a is about 530 V. This can be obtained by dividing the difference between the potential (about 500 V) in part of the semiconductor region 2 directly under the electrode 19a and the voltage (about 600 V) applied to the electrode 25-2 by the series circuit Ca2+Cb2.

FIG. 5 schematically illustrates potential profiles that were obtained under the same conditions. The profiles shown in FIG. 5 are represented by dashed equipotential lines. It should be noted that the potential profiles shown in FIG. 5 and results of simulations carried out by the present inventors showed similar tendencies.

As can be seen from FIG. 5, around the interface between the field oxide film 16 and semiconductor region 2, the oxide film 16 is at a higher potential level than almost all the semiconductor region 2. Accordingly, even if the high-temperature bias test is carried out on this device, no p-type inversion layer is formed under the interface. Thus, there is no concern about the decrease in initial breakdown voltage of the device. We also found that the electric field was not concentrated around the end of the plate electrode 18a, closer to the plate electrode 17a, so much in the second embodiment as the first embodiment where the metal electrodes 25-1 and 25-2 are as wide as the electrodes 18a and 19a. This effect was attained because the widths of the metal electrodes 25-1 and 25-2 were halved in the second embodiment. Specifically, an initial breakdown voltage of 700 V, which is higher than that of the first embodiment by about 200 V, could be obtained according to the second embodiment.

In the second embodiment, the coupling capacitance between the plate electrode 18a or 19a and semiconductor region 2 can be greater than the coupling capacitance between the electrode 18a or 19a and extended metal electrode 25-1 or 25-2. Thus, the potential difference between the plate electrode 18a or 19a and the underlying part of the semiconductor region 2 can be reduced. As a result, the electric field is not concentrated so much around the end of the plate electrode 18a, closer to the plate electrode 17a and the initial breakdown voltage of the device can be kept sufficiently high. Furthermore, the breakdown voltage does not decrease even during the high-temperature bias test.

Following is the conditions adopted for the experiments we carried out for the first and second embodiments. The p-type semiconductor substrate 1 had a resistivity of 50 Ω·cm. The n-type semiconductor region 2 had a resistivity of 5 Ω·cm and a thickness of 15 $\mu$m. The n-type doped buried region 3 had a peak of $1\times10^5(\text{cm}^{-3})$ for impurity concentration and a depth of about 8 $\mu$m. The field oxide film 16 was 2 $\mu$m thick. The interlayer dielectric film 34 had a two-layer structure consisting of a CVD film with a thickness of 1.2 $\mu$m and a CVD film containing 8.5 wt % of phosphorus and having a thickness of 1.8 $\mu$m. The protective film 35 also had a two-layer structure consisting of a CVD film containing 4.0 wt % of phosphorus and having a thickness of 0.5 $\mu$m and a nitride film with a thickness of 1.0 $\mu$m. When we carried out a high-temperature bias test under these conditions, good test results could be obtained. That is to say, the breakdown voltage (the breakdown voltage between the terminal 108 in FIG. 16 to which the voltage V2 is applied and the ground potential GND) between the metal electrodes 25 and 33 hardly decreased.

In the second embodiment, the metal electrodes 25-1 and 25-2 are half as wide as the underlying plate electrodes 18a and 19a. However, if the semiconductor device should have a relatively low breakdown voltage (e.g., about 500 V), then the metal electrodes 25-1 and 25-2 may be relatively wide (e.g., about ⅔ as wide as the plate electrodes 18a and 19a). Conversely, if the breakdown voltage should be relatively high, then the metal electrodes 25-1 and 25-2 may be relatively narrow (e.g., about ¼ as wide as the plate electrodes 18a and 19a).

It should be noted that the structure of the second embodiment is effective on the supposition that the protective film 35 always ensures good insulation in any situation. In that case, there is no problem even if each of the metal electrodes 25-1 and 25-2 is half as wide as the plate electrode 18a or 19a located directly under the metal electrodes. In this structure, however, if the protective film 35 has lost its insulation properties partially due to some defects created, then the plate electrode 19a at the higher potential level will likely be affected by the loss. To avoid this unfavorable phenomenon, the device of the first embodiment may be modified as will be described next for the third embodiment of the present invention.

Embodiment 3

Hereinafter, a high-voltage semiconductor device according to the third embodiment will be described with reference to FIG. 6.

Figure 6:
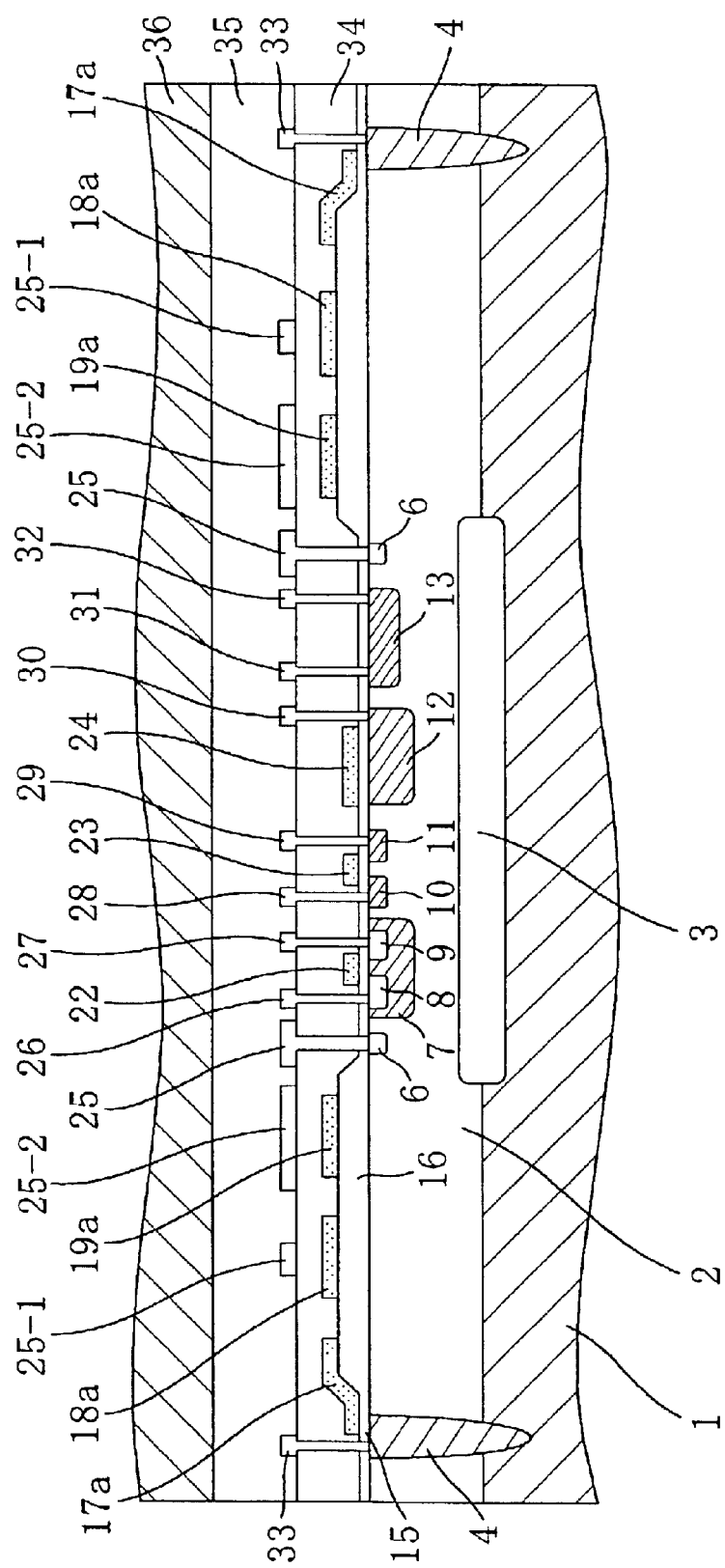
FIG. 6 is a cross-sectional view illustrating a structure for a main part of a high-voltage semiconductor device according to a third embodiment of the present invention.

FIG. 6 schematically illustrates a cross-sectional structure for a main part of the device of the third embodiment. In this embodiment, unlike in the second embodiment, a ratio of coupling capacitance between the electrodes 18a and 25-1 to that between the electrode 18a and semiconductor region 2 is different from a ratio of coupling capacitance between the electrodes 19a and 25-2 to that between the electrode 19a and region 2. In such a structure, the plate electrode 19a at the higher potential level is not affected so much even if the protective film 35 has partially lost its insulation properties.

In the structure shown in FIG. 6, the loop-shaped metal electrode 25-1 is half as wide as the plate electrode 18a, while the other loop-shaped metal electrode 25-2 is wider than the plate electrode 19a. In other words, the metal electrode 25-2 is wide enough to cover the entire upper surface of the plate electrode 19a, which is located closest to the contact region 6, via the interlayer dielectric film 34. In the other respects, the device of the third embodiment is the same as the counterparts of the first and second embodiments and the description thereof will be omitted herein.

Even when the metal electrode 25-2 is made wider than the underlying plate electrode 19a as is done in this embodiment, the parasitic capacitance Cb2 formed between the plate and metal electrodes 19a and 25-2 is substantially the same. Thus, almost the same effects as those of the foregoing embodiments are attainable.

Figure 7:
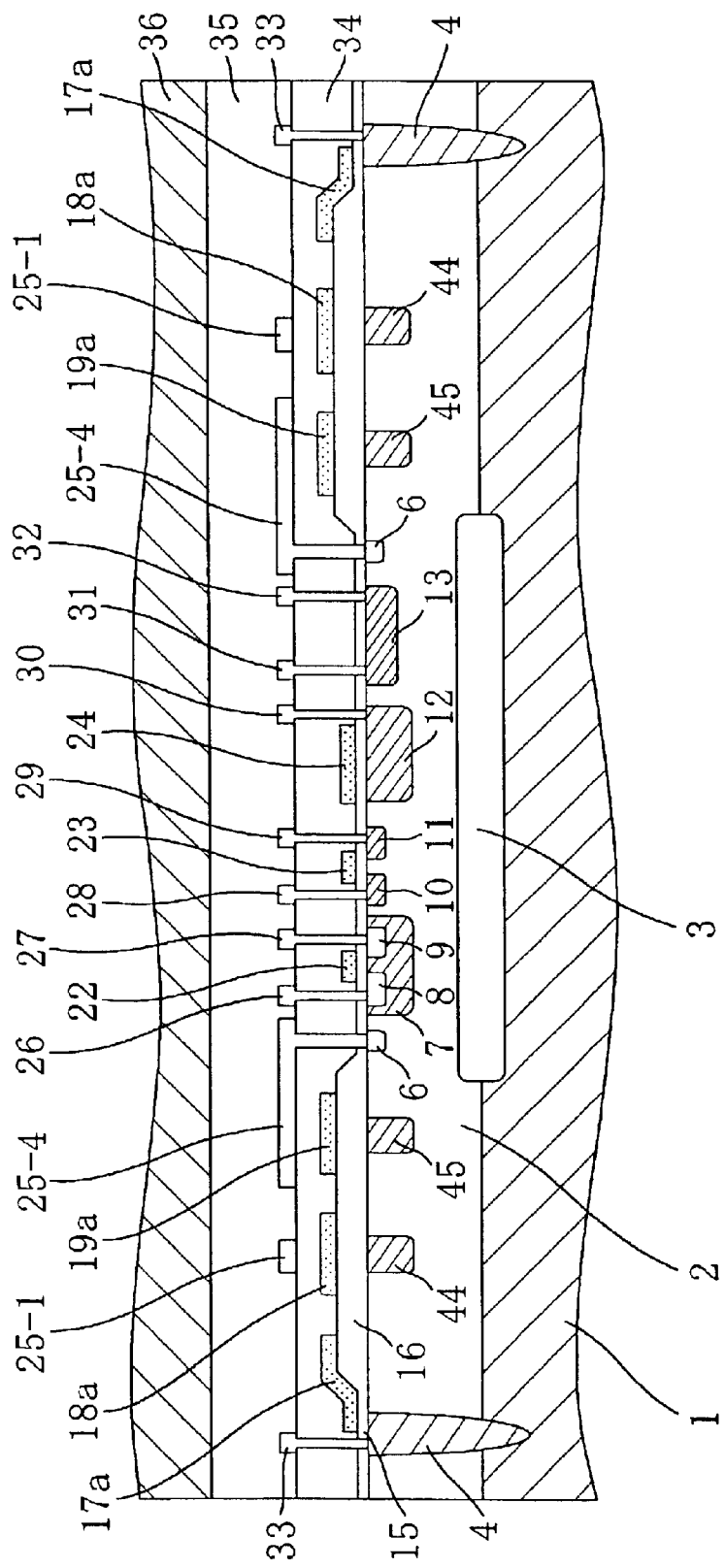
FIG. 7 is a cross-sectional view illustrating a structure for a main part of a high-voltage semiconductor device according to a modified example of the third embodiment.

The same effects are also attainable even if a metal electrode 25-4 is formed as shown in FIG. 7 by further widening the electrode 25-2 shown in FIG. 6 and combining the electrode 25-2 with the metal electrode 25 as a drain electrode. FIG. 7 illustrates a modified example for the structure shown in FIG. 6. The device shown in FIG. 7 is the same as the counterpart shown in FIG. 6 except that the former device includes the metal electrode 25-4 and p-type guard ring regions 44 and 45, which will be described in detail later. Optionally, the p-type guard ring regions 44 and 45 may be omitted from the device shown in FIG. 7.

In the structure shown in FIG. 7, the metal electrode 25-4 entirely covers the upper surface of the electrically floating plate electrode 19a. Accordingly, even if the protective film 35 has partially lost its insulation properties due to defects created, the adverse effects of the poor insulation are blocked by the metal electrode 25-4. This is because the drain voltage is applied to the metal electrode 25-4. As a result, the plate electrode 19a and semiconductor region 2 directly under the metal electrode 25-4 are not affected.

The electrically floating plate electrode 18a, located closer to the isolating region 4, has its potential determined by the series circuit consisting of the parasitic capacitance Ca1 between the electrode 18a and semiconductor region 2 and the parasitic capacitance Cb1 between the electrodes 18a and 25-1. Since the metal electrode 25-1 is half as wide as the plate electrode 18a, Ca1/Cb1 is about two. Accordingly, the potential at the plate electrode 18a is set slightly higher than the potential at the underlying part of the semiconductor region 2. For that reason, no p-type inversion layer is formed under the surface of the semiconductor region 2. And the breakdown voltage of the device does not decrease even if the device is subjected to a life test like a high-temperature bias test. In addition, the surface potential of the semiconductor region 2 can be decreased gradually by the metal electrodes 25-1 and 25-2 (or 25-4). As a result, excessive concentration of electric field is avoidable and the initial breakdown voltage can be kept high.

Even if defects have been created in the protective film 35, the potential at the metal electrode 25-1 can be kept equal to the voltage having been applied to 25-1 because the electrode 25-1 is connected to the metal electrode 25. That is to say, the potential at the electrode 25-1 is not affected by the insufficient insulation. Also, if regions surrounding the metal electrode 25-1 have become electrically conductive due to the loss of the insulation properties, then those conductive regions are at a potential level equal to that of the metal electrode 25-1. As a result, the parasitic capacitance Cb1 increases correspondingly and the potential at the plate electrode 18a becomes relatively high. That is to say, even if the protective film 35, which is easily affected by a stress, has partially lost its insulation properties, a highly reliable high-voltage semiconductor device is still achieved so long as the loss is not significant.

Figure 8:
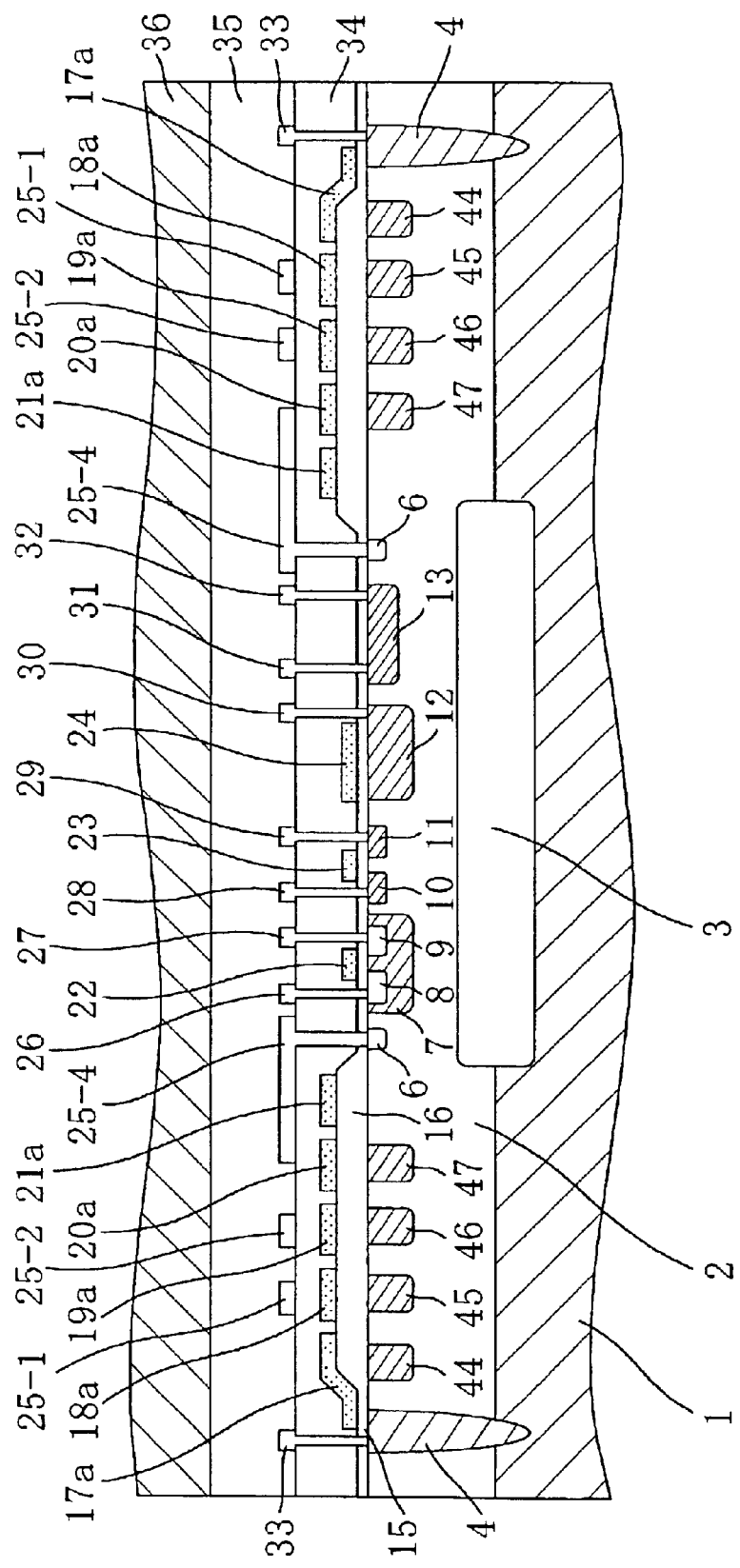
FIG. 8 is a cross-sectional view illustrating a structure for a main part of a high-voltage semiconductor device according to another modified example of the third embodiment.

In the foregoing embodiments illustrated in FIGS. 1 through 7, two electrically floating plate electrodes 18a and 19a are used. However, the number of plate electrodes is not limited to two according to the present invention. If necessary, three, four or more plate electrodes may be provided and the same number of metal electrodes may be formed over the plate electrodes. FIG. 8 illustrates a modified example of the embodiment shown in FIG. 7, which includes five plate electrodes and four p-type guard ring regions. When we carried out a high-temperature bias test on the device with such a structure, good test results could be obtained. That is to say, the breakdown voltage (the breakdown voltage between the terminal 108 in FIG. 16 and the ground potential GND) between the metal electrodes 25 and 33 hardly decreased.

Following are the conditions for the structure of the embodiment shown in FIG. 8. The p-type semiconductor substrate 1 had a resistivity of 50 Ω·cm. The n-type semiconductor region 2 had a resistivity of 5 Ω·cm and a thickness of 20 μm. The n-type doped buried region 3 had a peak of $1\times10^{15}$ (cm$^{-3}$) for impurity concentration and a depth of about 8 μm. The p-type guard ring region 44, 45, 46 and 47 had a surface impurity concentration of $5\times10^{16}$ (cm$^{-3}$) and a junction depth of 5 μm. In the structure with no p-type guard ring region, the n-type semiconductor region 2 should have a resistivity of 5 Ω·cm and a thickness of 15 μm. This is because it is necessary to reduce in the thickness of the semiconductor region 2 and thereby make regions surrounding the semiconductor region 2 easy to be depleted so that the re-surf technique can be utilized.

The field oxide film 16 was 2 μm thick. The interlayer dielectric film 34 had a two-layer structure consisting of a CVD film with a thickness of 1.2 μm and a CVD film containing 8.5 wt % of phosphorus and having a thickness of 1.8 μm. The protective film 35 also had a two-layer structure consisting of a CVD film containing 4.0 wt % of phosphorus and having a thickness of 0.5 μm and a nitride film with a thickness of 1.0 μm. The plate electrodes 17a, 18a, 19a, 20a and 21a were each formed by a phosphorus doped n-type polysilicon electrode. Each of the plate electrodes, shown in the cross-sectional view of FIG. 8, had a thickness of 0.5 μm and a width of 18 μm. The distance between the plate electrodes was 3 μm. The metal electrodes 25-1, 25-2 and 25-4 were each formed by a 1% silicon doped Al electrode and had a thickness of 1.2 μm. The metal electrodes 25-1 and 25-2 had a width of 7 μm and the part of the metal electrode 25-4 overlapping with the plate electrode 20a had a width of 6 μm. The present inventors believe that the structure of the embodiment shown in FIG. 8 is the most preferable structure to ensure breakdown voltage margin and thus that the above conditions are ideal. It should be also noted that the simplified structure of the device is shown in FIGS. 4 and 5 for describing the operation of the device and thus the conditions, including size, are slightly different from the above described ones.

Also, the structure may be modified in the following manner. For example, if the metal electrodes are stepwise narrowed in width as they are located farther from the contact region 6, then, the concentration of electric field can be further reduced, the initial breakdown voltage can be kept high and the device is even less affected by the insufficient insulation of the protective film. That is to say, in such a structure, the plate electrode located more distant from the contact region 6 has a greater coupling capacitance (i.e., smaller potential difference) between the plate electrode and semiconductor region 2. Thus, the electric field concentration can be reduced over the entire semiconductor region and the initial breakdown voltage can be kept high. On top of that, the breakdown voltage does not decrease even during a high-temperature bias test.

Figure 9:
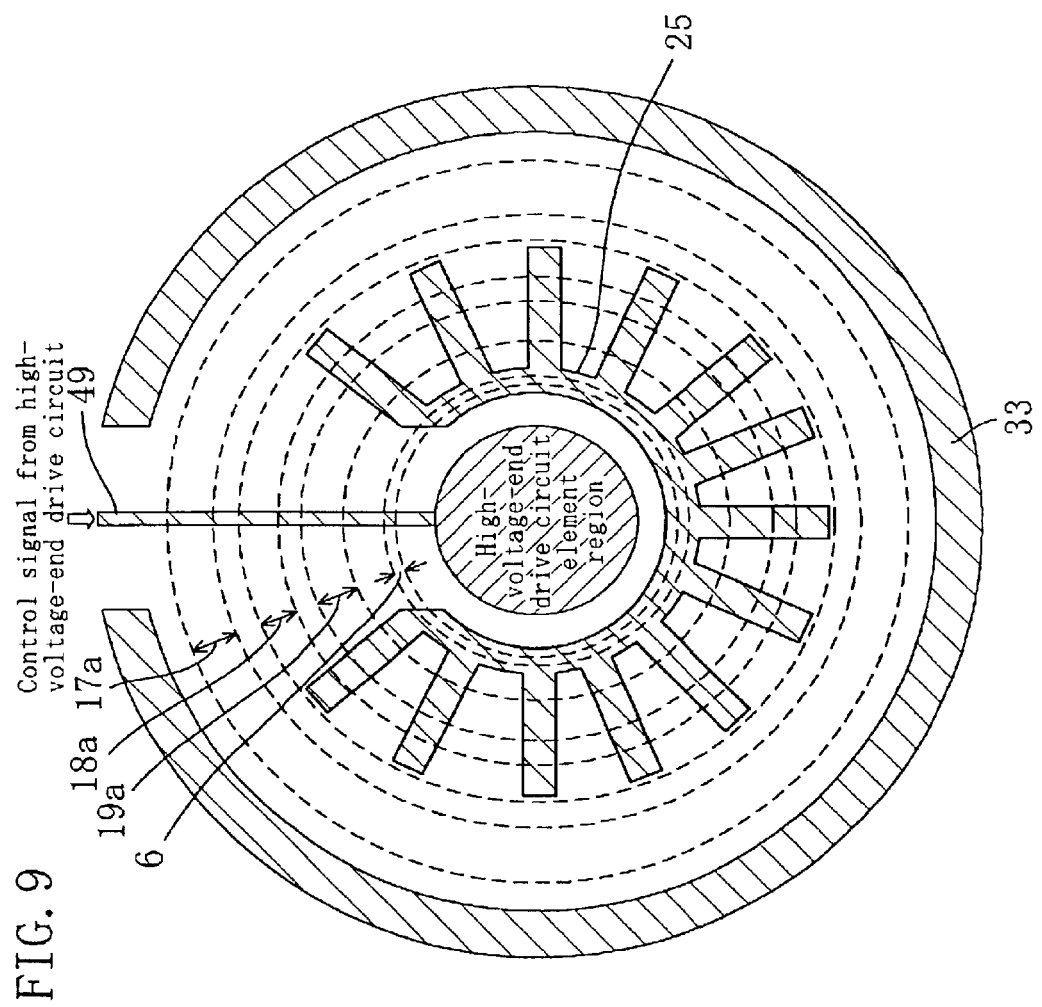
FIG. 9 is a plan view illustrating a layout for the device shown in FIG. 7.
Figure 10:
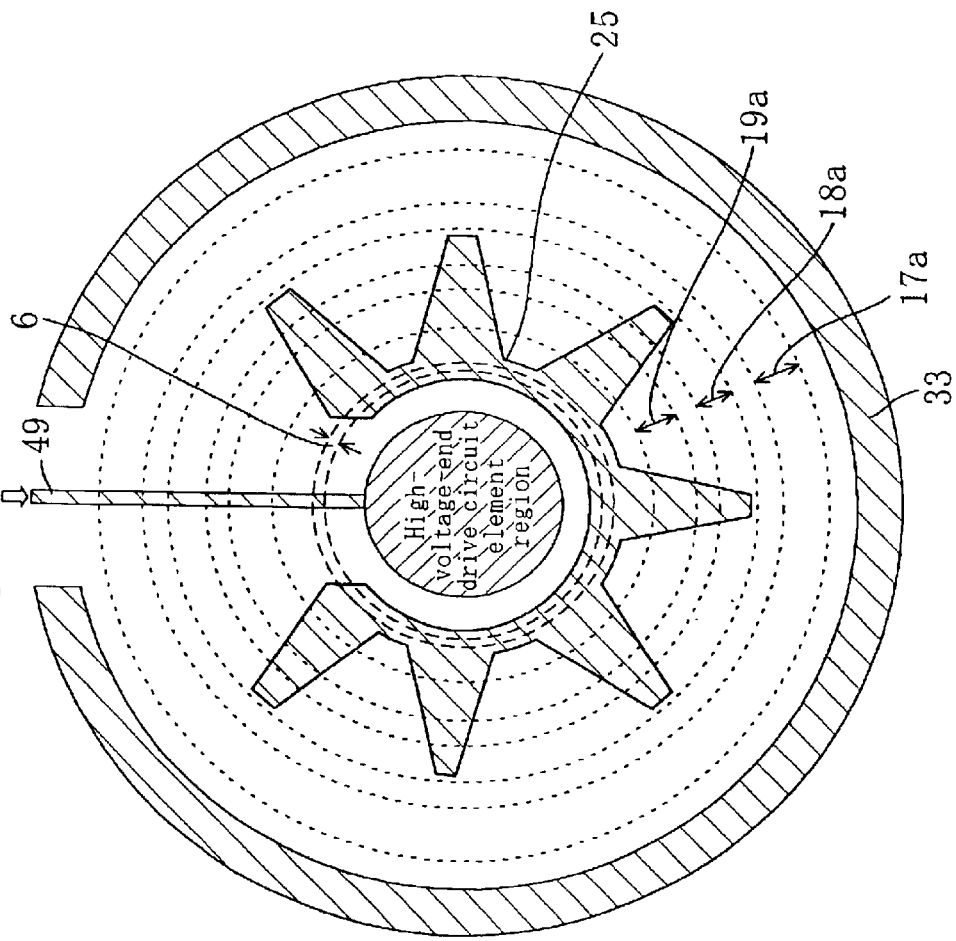
FIG. 10 is a plan view illustrating a layout for the device shown in FIG. 7.

In the foregoing embodiments, part (e.g., 25-1) of the metal electrode 25 is formed in the shape of an approximately rectangular loop. Alternatively, as shown in FIG. 9, the high-voltage-end drive circuit element region may be formed in the shape of an approximate circle and sections of the metal electrode 25 are extended radially as viewed normal to the substrate. That is to say, the extended sections of the metal electrode 25 may cross the plate electrodes 18a and 19a. Even in such a structure, the creation of negative mobile charges is still avoidable at the time of a high-temperature bias test and the decrease in initial breakdown voltage is also suppressible as in the foregoing embodiments. Also, as shown in FIG. 10, each of the extended sections of the metal electrode 25 has a wider width at the base than at the edge. Then, the plate electrodes at the higher potential level are hardly affected even if the protective film 35 has partially lost its insulation properties.

Figure 11:
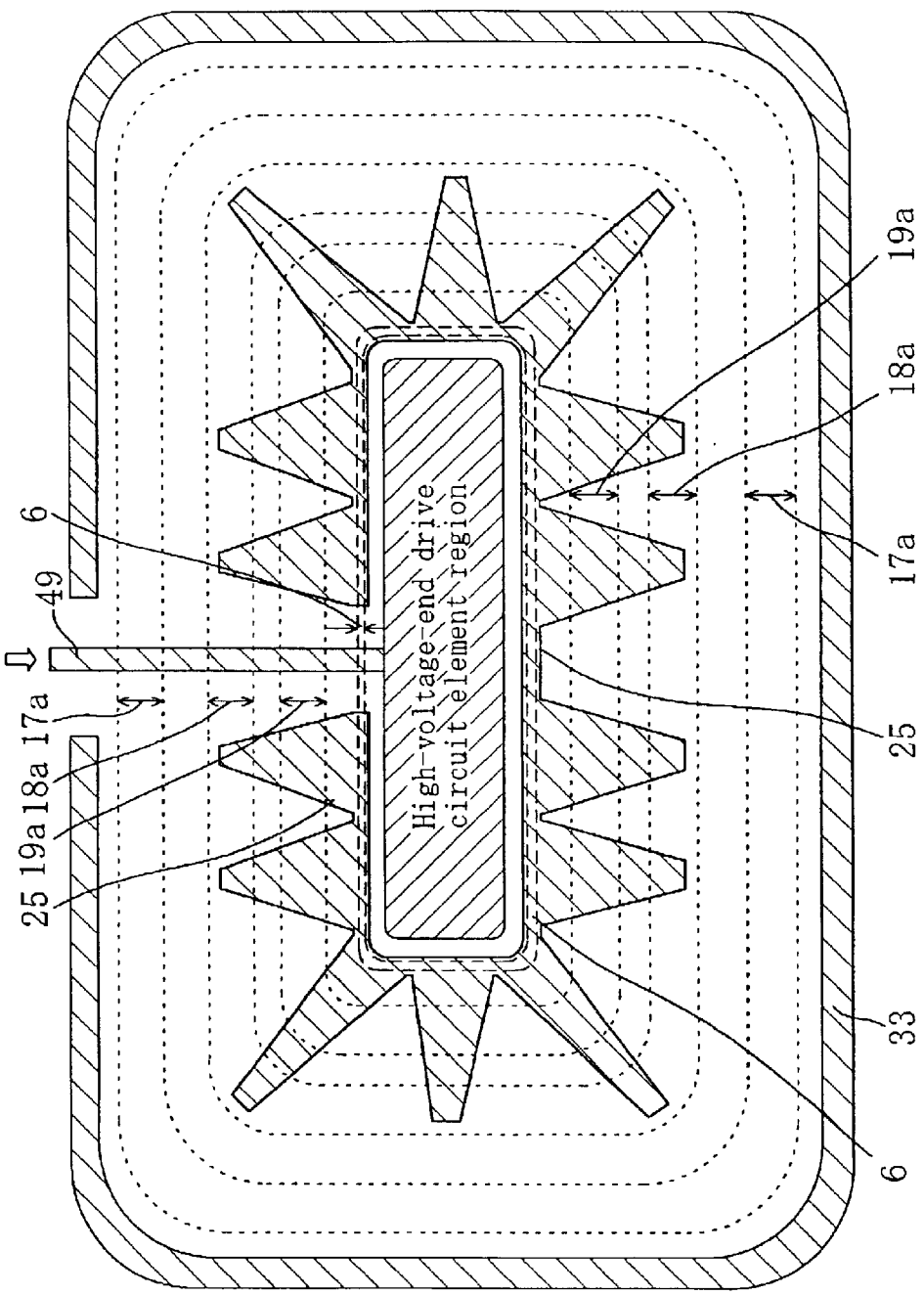
FIG. 11 is a plan view illustrating a layout for the device shown in FIG. 8.

Furthermore, as shown in FIG. 11, in the structure in which the high-voltage-end drive circuit element region has been formed in the shape of an approximate rectangular, sections of the metal electrode 25 may be formed so as to extend radially. In this structure, as well, each of the extended sections of the metal electrode 25 preferably has a wider width at the base than at the edge in order that the plate electrodes at the higher potential level are hardly affected even if the protective film 35 has partially lost its insulation properties.

Embodiment 4

Hereinafter, a high-voltage semiconductor device according to a fourth embodiment of the present invention will be described with reference to FIG. 12.

Figure 12:
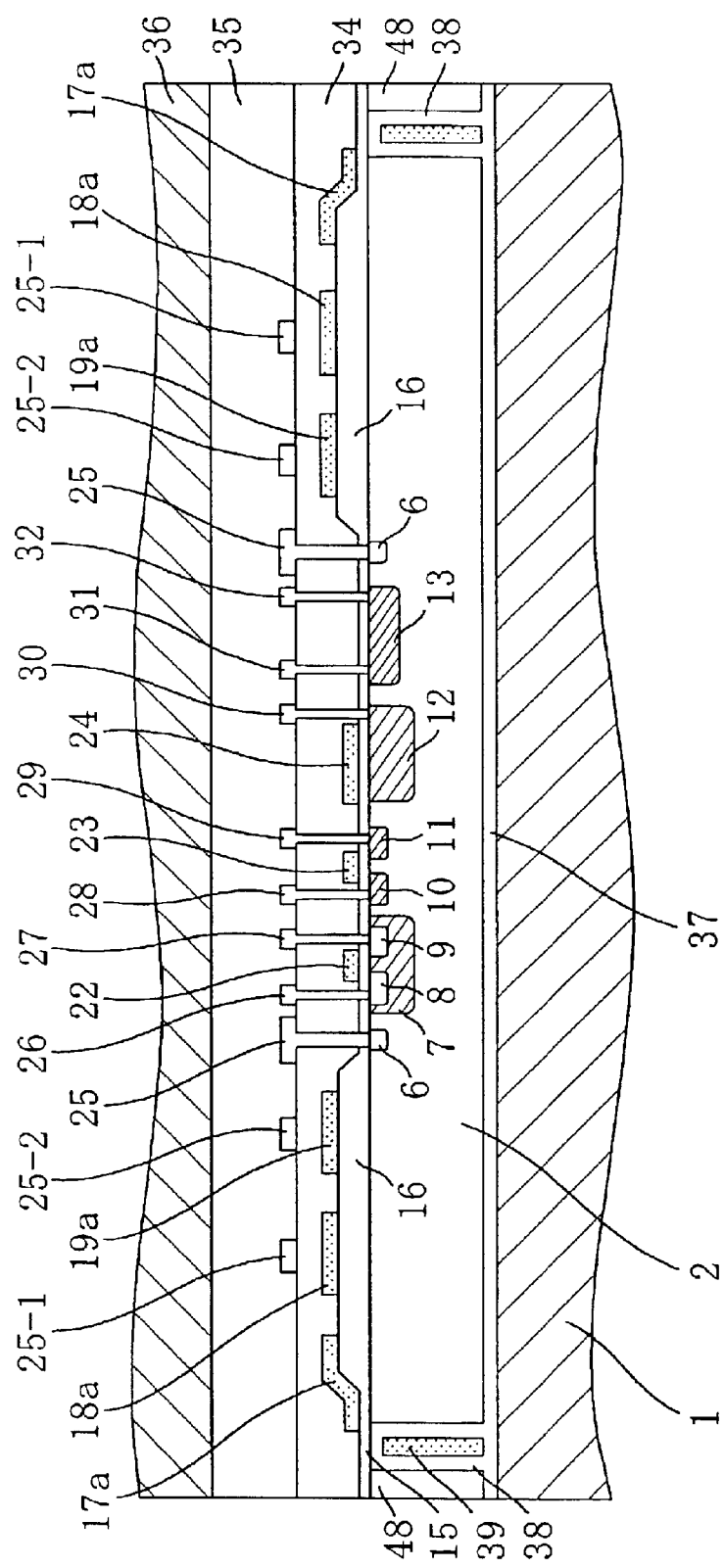
FIG. 12 is a cross-sectional view illustrating a structure for a main part of a high-voltage semiconductor device according to a fourth embodiment of the present invention.

FIG. 12 schematically illustrates a cross-sectional structure for a main part of the device of the fourth embodiment. Unlike the devices of the foregoing embodiments with the pn junction isolation structure, the device of the fourth embodiment has a dielectric isolation structure. Similar features will not be described for the sake of simplicity.

The device of the fourth embodiment has a structure in which the semiconductor region 2 is entirely surrounded with an insulator by a dielectric isolation technique. Specifically, a bonding oxide film 37 is formed on the p-type semiconductor substrate 1 and the semiconductor region 2 is defined in the oxide film 37. A trench is formed around the semiconductor region 2. And the trench is filled in with an isolating oxide film 38 and a polysilicon layer 39.

Next, it will be described how the device with this structure operates. Normally, the device is operated with a ground potential applied to a plate electrode 17a, the semiconductor substrate 1 and an n-type semiconductor region 48, and the voltage V2 applied to the metal electrode 25 for driving the high-voltage-end drive circuit.

In the structure shown in FIG. 12, as the voltage V2 applied to the metal electrode 25 is gradually increased, a depletion layer laterally expands from the isolating oxide film 38 toward the n-type contact layer 6. Another depletion layer expands upward from the bonding oxide film 37. While the depletion layer is expanding inconstantly depending on the voltage V2 applied to the metal electrode 25, the breakdown voltage of the device can be kept at its initial value. And when the depletion layer reaches an n-type heavily doped region like the contact region 6, the electric intensity increases and then a breakdown phenomenon occurs.

As can be seen, the re-surf technique for the first embodiment is also applicable to the device of the fourth embodiment, although the semiconductor region 2 is isolated differently from the first embodiment. The structure on the semiconductor region 2 may also be formed as in the second or third embodiment. Then, the reliability of the device about the breakdown voltage (particularly at a life test in which a bias voltage is applied at a high temperature) can be further improved. When the dielectric isolation structure of this embodiment is adopted, the parasitic capacitance between the semiconductor region 2 and substrate 1 can be extremely small. As a result, the resultant semiconductor device can advantageously operate at a very high frequency or switch at a very high speed and yet has a sufficiently high breakdown voltage.

Embodiment 5

Figure 13:
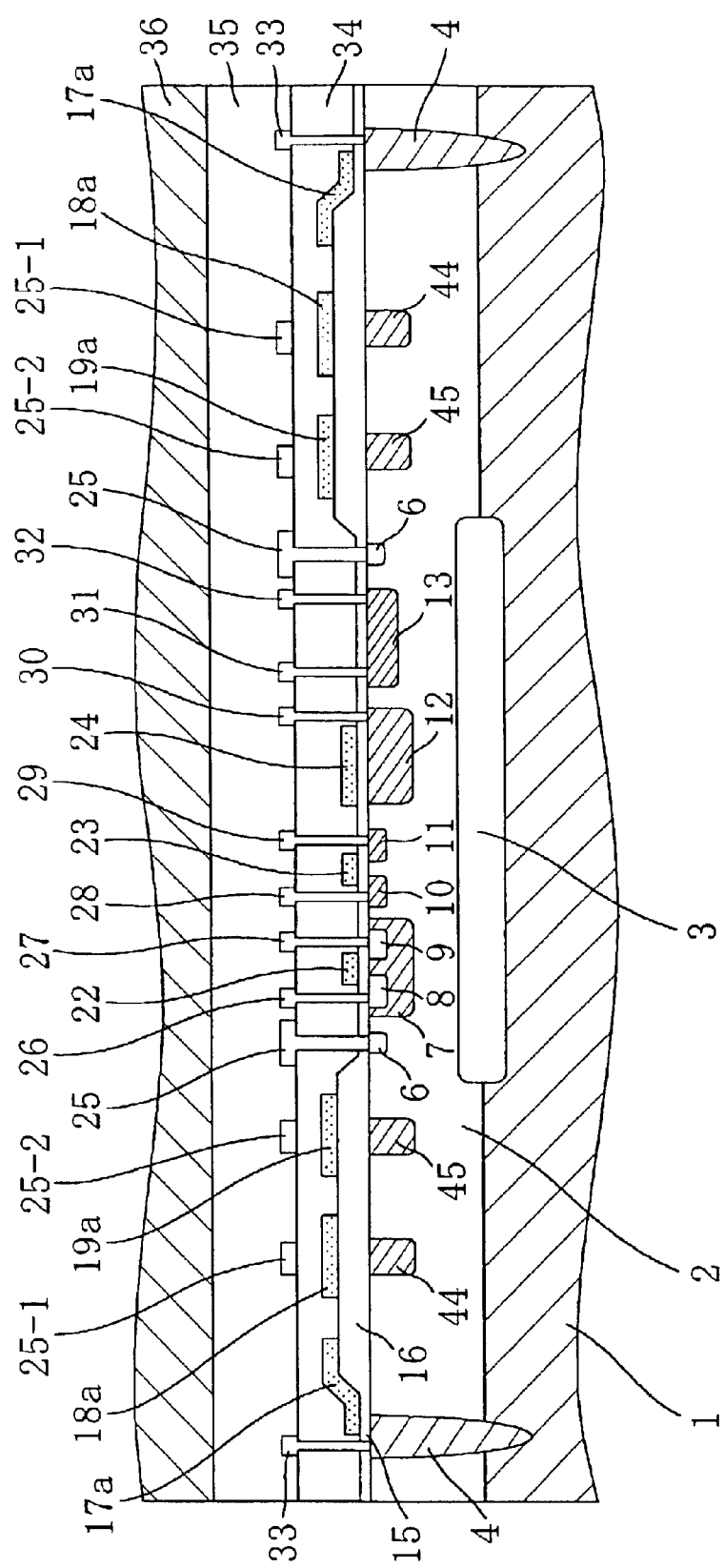
FIG. 13 is a cross-sectional view illustrating a structure for a main part of a high-voltage semiconductor device according to a fifth embodiment of the present invention.

Hereinafter, a high-voltage semiconductor device according to a fifth embodiment of the present invention will be described with reference to FIG. 13. FIG. 13 schematically illustrates a cross-sectional structure for a main part of the device of the fifth embodiment. The device of the fifth embodiment includes the guard ring regions 44 and 45, which are formed in respective parts of the semiconductor region 2 directly under the plate electrodes 18a and 19a, in addition to all components of the second embodiment shown in FIG. 5. In the other respects, the device of the fifth embodiment is the same as the device of the second embodiment. Thus, the description thereof will be omitted herein.

In this embodiment, the guard ring regions 44 and 45 are formed in respective parts of the semiconductor region 2 between the isolating and contact regions 4 and 6 by diffusing a p-type dopant thereto. Specifically, the guard ring regions 44 and 45 are located directly under the plate electrodes 18a and 19a, respectively.

Where the guard ring regions 44 and 45 are provided between the isolating and contact regions 4 and 6, a depletion layer, expanding laterally from the pn junction between the isolating and semiconductor regions 4 and 2, is combined with depletion layers expanding downward from the regions 44 and 45. Thus, the curvature of the combined depletion layer increases. As a result, the electric field concentration can be reduced and the initial breakdown voltage can be increased considerably.

In this embodiment, the plate electrode 18a or 19a has its potential determined by the series circuit consisting of the parasitic capacitance Cb1 or Cb2 between the electrode 18a or 19a and metal electrode 25 and the parasitic capacitance Ca1 or Ca2 between the electrode 18a or 19a and the surface of guard ring region 44 or 45. Accordingly, the potential at the plate electrode 18a or 19a can be higher than the surface potential of the guard ring region 44 or 45 or that of the semiconductor region 2. For that reason, the potential at the oxide film 16 can be higher than the surface potential of the semiconductor region 2. And no p-type inversion layer is formed under the surface of the n-type semiconductor region 2 even at the time of a high-temperature bias test. As a result, the initial breakdown voltage of the device hardly decreases and therefore the reliability of the device about the breakdown voltage can be further improved.

Figure 14A:
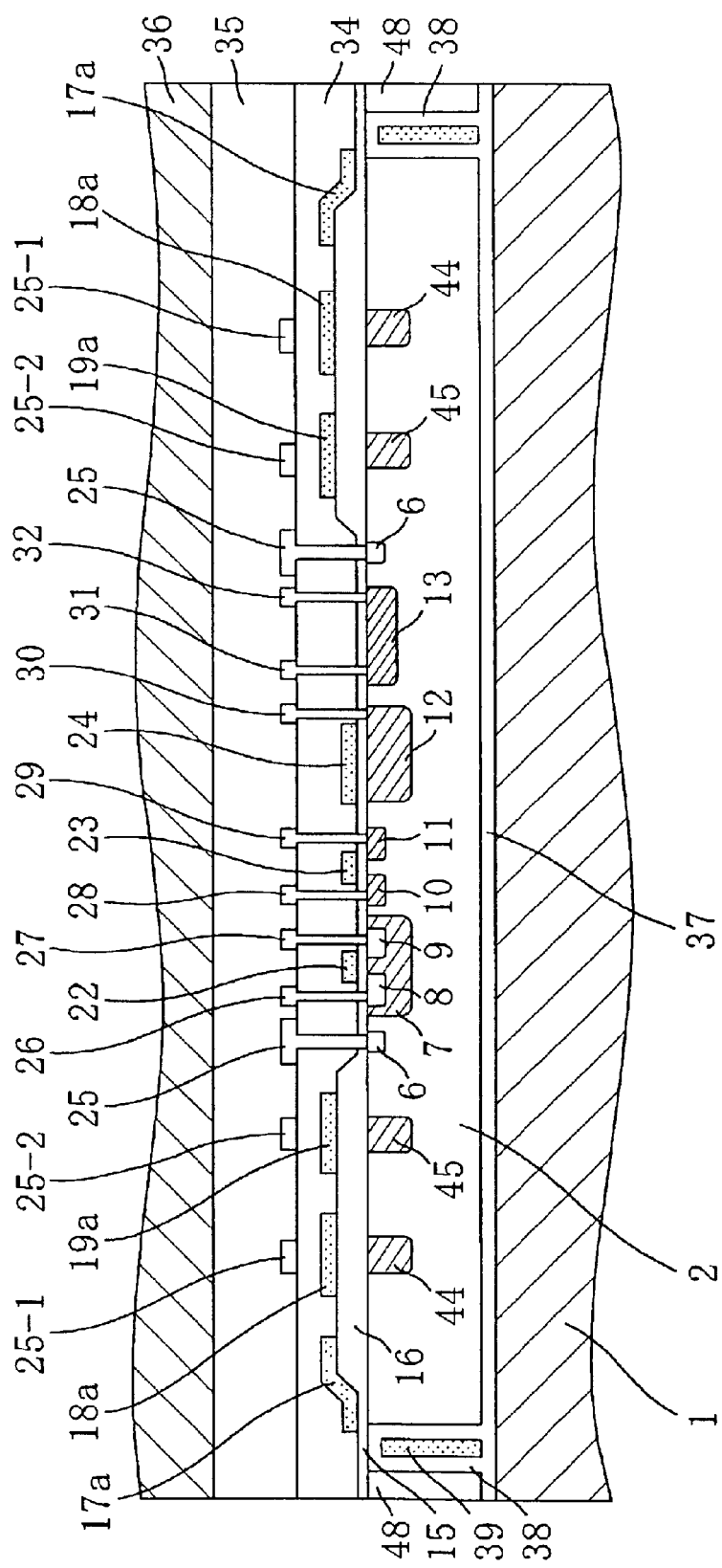
FIG. 14A is a cross-sectional view illustrating a structure for a main part of a high-voltage semiconductor device according to a modified example of the fifth embodiment.

The structure shown in FIG. 13 may be modified in the following manner. FIG. 14A illustrates a modified example for the structure shown in FIG. 13. The device of this modified example has a structure in which the semiconductor region 2 is entirely surrounded with an insulator by a dielectric isolation technique. Specifically, as shown in FIG. 14A, the device includes an SOI substrate, in which the bonding oxide film 37 is formed on the p-type semiconductor substrate 1 and the n-type semiconductor region 2 is defined on the oxide film 37. A trench is formed in the SOI substrate and filled in with the isolating oxide film 38 and polysilicon layer 39. The device shown in FIG. 14A is basically the same as the device shown in FIG. 11 except that the semiconductor region 2 is isolated with a dielectric. Thus, similar features will not be described herein.

As described for the fourth embodiment, the re-surf technique for the pn junction isolation structure is also applicable to the dielectric isolation structure. The breakdown voltage of the device shown in FIG. 14A is almost equal to that of the device shown in FIG. 13. Accordingly, by utilizing the dielectric isolation structure, a semiconductor device that has a high breakdown voltage and yet can operate at a high frequency is achieved.

Figure 14B:
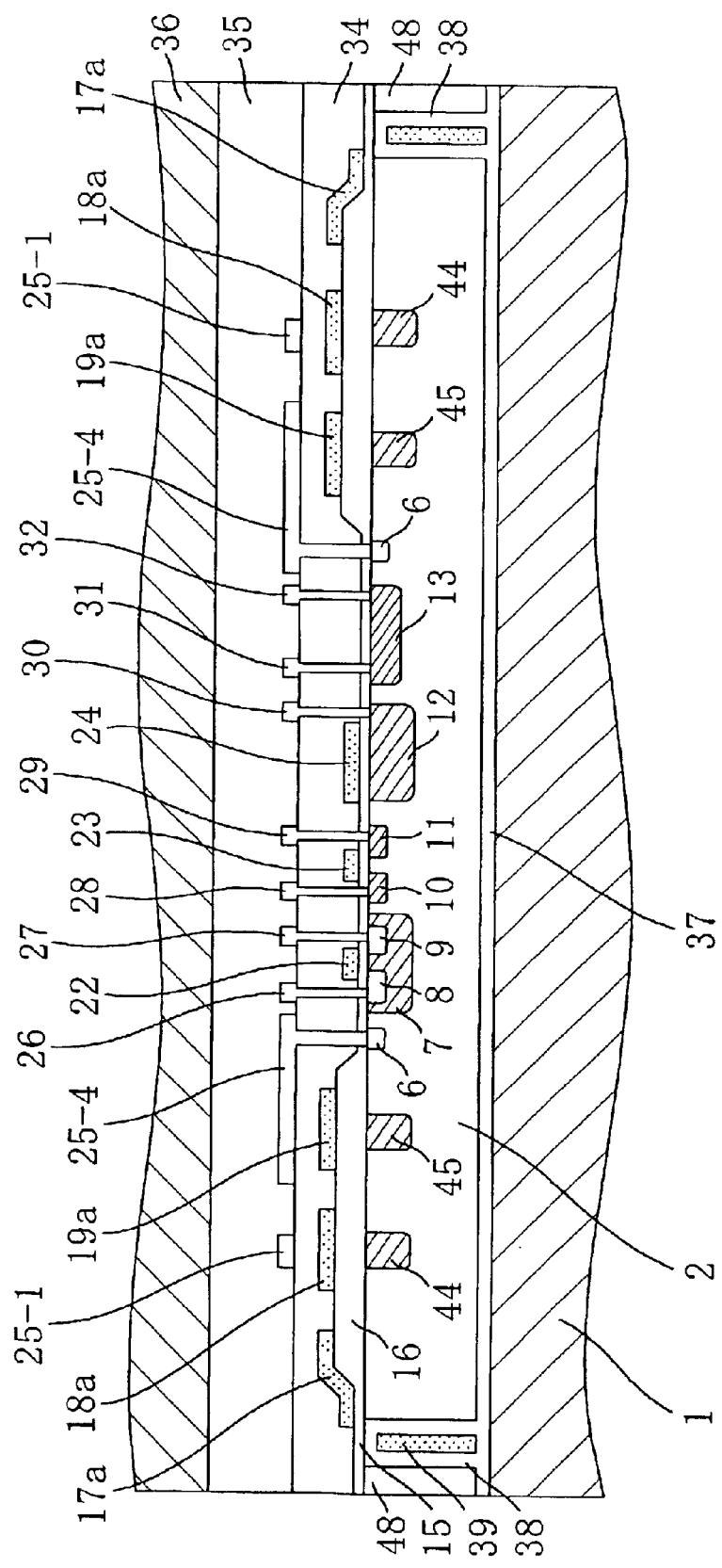
FIG. 14B is a cross-sectional view illustrating a structure for a main part of a high-voltage semiconductor device according to another modified example of the fifth embodiment.

Furthermore, the structure shown in FIG. 14A may be modified as shown in FIG. 14B. In the structure shown in FIG. 14B, the metal electrode 25-2 closest to the contact region 6 in the structure shown in FIG. 14A is combined with the metal electrode 25.

In the structure shown in FIG. 14A, the metal electrode 25-4 entirely covers the upper surface of the plate electrode 19a closest to the contact region 6. And the potential at the plate electrode 19a can be approximately equalized with the drain voltage. Thus, even if the protective film 35 has partially lost its insulation properties, the underlying layers are not affected. In addition, the width of the loop-shaped metal electrode 25-1, located over the plate electrode 18a is half of the width of the plate electrode 18a closer to the isolating region 4. Accordingly, the coupling capacitance formed between the plate electrode 18a and part of the semiconductor region 2 directly under the electrode 18a can be increased. As a result, the potential difference between the plate electrode 18a and that part of the semiconductor region 2 is not so large, the electric field concentration can be reduced and the initial breakdown voltage can be increased. Furthermore, even if the protective film 35 has partially lost its insulation properties to make regions surrounding the metal electrode 25-1 electrically conductive, the parasitic capacitance just increases correspondingly and the potential at the plate electrode 18a just increases slightly. Accordingly, the reliability of the device about the breakdown voltage is hardly affected.

In the foregoing embodiments, the examples in which the semiconductor region 2 is formed with the isolating region (doped isolating region, isolating trench) formed have been described. However, the isolating region is not always needed. It is also possible to form the semiconductor region 2 without the isolating region and then to form semiconductor elements (CMOS circuit, resistor, capacitor) in the semiconductor region 2. For forming the semiconductor region 2 without the isolating region, for example, the steps shown in FIGS. 15A, 15B and 15C may be performed.

Figure 15A:
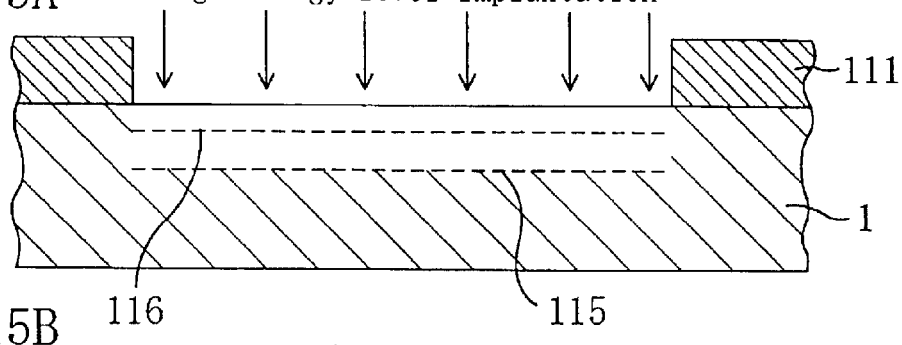
FIGS. 15A, 15B and 15C are cross-sectional views illustrating steps of forming a semiconductor region 2 without an isolating region.

First, as shown in FIG. 15A, for example, a resist 101 is formed on the p-type lightly doped semiconductor substrate 1 and then, using the resist 101 as a mask, a two-step ion implantation process, including a low-level-energy ion implantation step and a high-level-energy ion implantation step, is carried out on the semiconductor substrate 1. In FIG. 15A, the dotted line 115 indicates the position into which ions are implanted by the high-energy-level ion implantation step and the dotted line 116 indicates the position into which ions are implanted by the low-energy-level ion implantation step. Thereafter, heating treatment is carried out and thereby an n-type well region (semiconductor region) 2 can be obtained as shown in FIG. 15B.

Figure 15B:
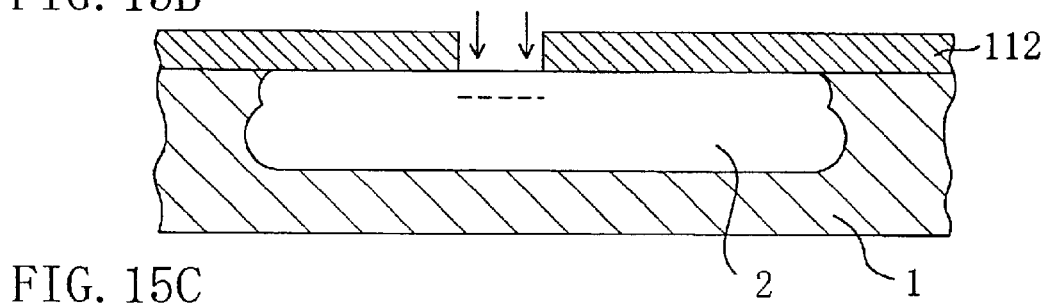
Figure 15C:
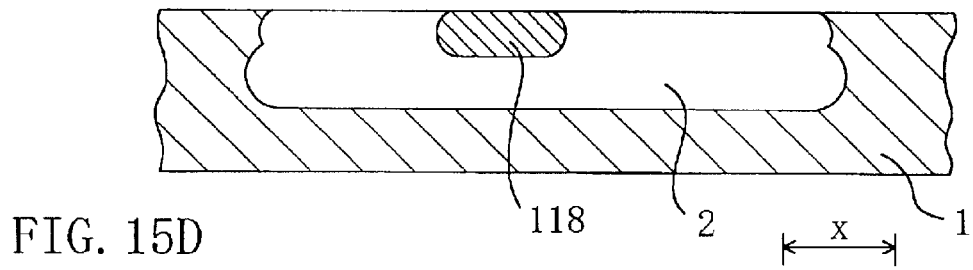

Thereafter, a doped region 118 (e.g., the p-type doped layer 7 as the p-type well) may be formed by carrying out ion implantation is carried out using a resist 102 as a mask and then heating treatment, as shown in FIG. 15C. In this manner, after the n-type well region (semiconductor region) 2 has been formed, the semiconductor elements can be formed in the n-type well region (semiconductor region) 2 using a known technology. Accordingly, the device structure that has been described in the foregoing embodiments can be achieved.

In formation of the n-type well region 2 of this embodiment, when, for example, phosphorus is used as an n-type impurity, phosphorus may be implanted into part of the semiconductor substrate which is located at a small distance from the surface of the substrate using low-energy ion implantation with an acceleration energy of 70 KeV through 300 KeV and into part of the substrate which is located at a large distance from the surface of the substrate using high-energy ion implantation with an acceleration energy of 500 KeV through 5 MeV, and then a heat treatment may be carried out.

If the technology illustrated in FIGS. 15A, 15B and 15C is employed, the epitaxial layer does not have to be used and/or the isolating region, surrounding the semiconductor 2, is not required, and therefore the number of steps can be largely reduced. As a result, advantage in which fabrication cost can be greatly reduced can be obtained.

Figure 15D:
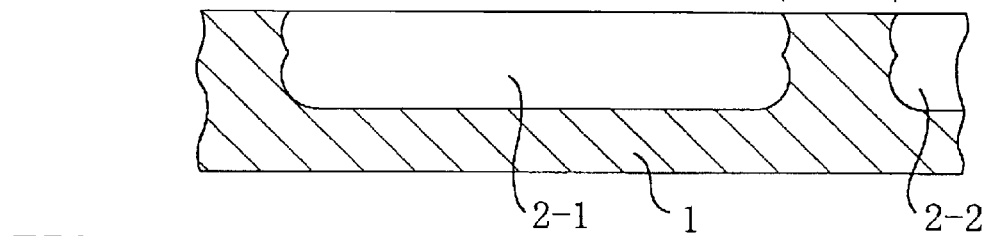
FIG. 15D is a cross-sectional view schematically illustrating the structure in which electrical isolation is carried out only to a semiconductor substrate 1.

Moreover, where multiple semiconductor devices are fabricated on a substrate according to the technology illustrated in FIGS. 15A, 15B and 15C, as shown in FIG. 15D, adjacent n-type well regions 2-1 and 2-2 are electrically isolated from each other by only the lightly doped p-type semiconductor substrate 1. In a device having such structure, when a high voltage is applied to the metal wiring (not shown in the figures) formed over the semiconductor substrate 1, part of surface of the semiconductor substrate 1 located directly under the metal wiring changes into the opposite type, or n-type, often causing the inversion layer to appear. Then, this often causes a leakage current to flow in between the n-type well regions 2-1 and 2-2 (x in FIG. 15D), and thus the electrical isolation between the transistors including the regions 2-1 and 2-2 often becomes to be imperfect.

However, such problem in electrical isolation can be solved, if an enough clearance x is ensured between the n-type well regions 2-1 and 2-2. Therefore, if the clearance x is increased in the case of an output transistor to which a high voltage is applied, whereas the clearance x is reduced in the case of a transistor for processing small signals, it is possible to electrically isolate adjacent devices without reducing the IC integration level.

Figure 15E:
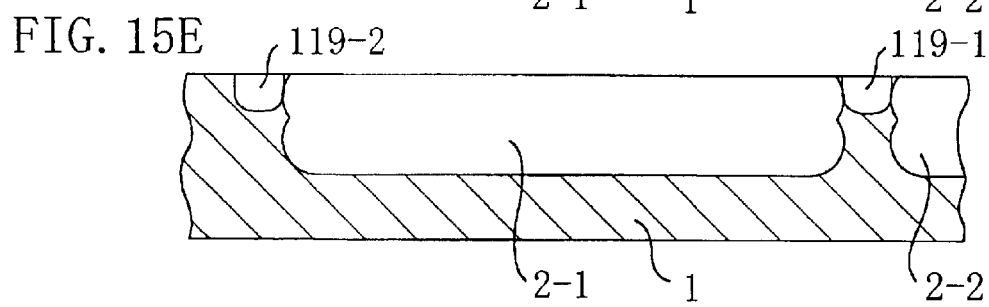
FIG. 15E is a cross-sectional view schematically illustrating the structure in which a heavily doped isolation region 109 is formed.

Moreover, as shown in FIG. 15E, the problem in electrical isolation can be also solved by forming of the p-type heavily doped isolation region 119 on part of the surface of the substrate between the n-type well regions 2-1 and 2-2. When the p-type heavily doped isolation region 119 (119-1 and 119-2) is formed in such a manner, the n-type inversion layer can be prevented from appearing on the part of the surface of the semiconductor substrate 1 which is located directly under the metal wiring, independently of the applied voltage to the metal wiring (not shown). Accordingly, it is possible to achieve a good electrical isolation property even if the clearance x between adjacent ones of the multiple output transistors (semiconductor regions 2-1, 2-2) to which a high voltage is applied is reduced, thus allowing an increased integration level of a high-breakdown-voltage semiconductor device.

The preferred examples according to the present invention have been described in the foregoing embodiments. These illustrative descriptions does not limit the invention and, of course, various modifications can be made.

In the inventive high-voltage semiconductor device, portions of a metal electrode are extended onto an interlayer dielectric film and are located over electrically floating plate electrodes formed on a field insulating film. And those sections of the metal electrode are capacitively coupled to the plate electrodes. Accordingly, a highly reliable high-voltage semiconductor device, having a breakdown voltage hardly decreasing even during an operation at an elevated temperature, can be obtained. Where the inventive device is implemented as a high-voltage semiconductor device for inverter control with a high-voltage-end drive circuit, an inverter control system having a high reliability even during an operation at an elevated temperature can be achieved.

What is claimed is:

1. A high-breakdown-voltage semiconductor device, comprising:
   a semiconductor substrate whose conductivity is of a first type;
   a semiconductor region whose conductivity is of a second type, formed on the substrate;
   a doped contact region whose conductivity is of the second type, formed in the semiconductor region;
   a doped isolating region whose conductivity is of the first type, formed within the semiconductor region to be spaced apart from and surround the doped contact region;
   a field insulating film deposited over the semiconductor region located between the doped isolating and doped contact regions;

a metal electrode electrically connected to the doped contact region;

a plurality of plate electrodes electrically floating over the field insulating film, formed spaced apart from and, viewed normal to the substrate, surrounding the doped contact region; and an interlayer dielectric film formed over the field insulating film and the plurality of plate electrodes; wherein the metal electrode includes a plurality of sections, each of which serves as a loop-shaped metal electrodes, and a connection portion that connects each loop-shaped metal electrode to the doped contact region, while each of the plurality of plate electrodes is directly covered only by each associated loop-shaped metal electrode with the interlayer dielectric film interposed therebetween, and the loop-shaped metal electrode is capacitively coupled with the associated one of the plate electrodes, and a CMOS circuit, and either a resistor, a capacitor, or both, are provided in the second-conductivity-type semiconductor region surrounded by the second-conductivity-type doped contact region.

2. The semiconductor device of claim 1, being an inverter-control high-voltage semiconductor device including a high-voltage-end drive circuit, wherein the high-voltage-end drive circuit includes the CMOS circuit, and either the resistor, the capacitor, or both.

3. The semiconductor device of claim 1, wherein at least one of the loop-shaped metal electrodes is narrower in width than the plate electrodes capacitively coupled to the metal electrode.

4. The semiconductor device of claim 1, wherein one of the loop-shaped metal electrodes covers the entire upper surface of that plate electrode among the plurality of plate electrodes that is located nearest the doped contact region with the interlayer dielectric film interposed between the section and the plate electrode.

5. The semiconductor device of claim 1, wherein the more distant from the doped contact region each of the loop-shaped metal electrodes is, the narrower its width becomes.

6. The semiconductor device of claim 1, wherein a plurality of guard-ring regions whose conductivity is of the first type are formed in the upper portion of the semiconductor region located under an associated one of the plate electrodes.

7. The semiconductor device of claim 1, wherein a buried region whose conductivity is of the second type is formed in a location corresponding to a circuit element region for a high-voltage-end drive circuit between the first-conductivity-type semiconductor substrate and the second-conductivity-type semiconductor region.

8. The semiconductor device of claim 1, further comprising:

a surface protective film formed over the metal electrode and the interlayer dielectric film; and a plastic encapsulant formed over the surface protective film.

9. The semiconductor device of claim 8, wherein the surface protective film is a multi-layered film including an upper layer made of a polyimide resin and an insulating layer made of an inorganic material as a lower layer.

10. A high-breakdown-voltage semiconductor device, comprising:

a semiconductor substrate whose conductivity is of a first type;

an insulating layer formed on the substrate;

a semiconductor region whose conductivity is of a second type, disposed over the insulating layer;

a doped contact region whose conductivity is of the second type, formed in the semiconductor region;

an isolating region formed within the semiconductor region to be spaced apart from and surround the doped contact region;

a field insulating film deposited over the semiconductor region located between the isolating region and the doped contact region;

a metal electrode electrically connected to the doped contact region;

a plurality of plate electrodes electrically floating over the field insulating film, formed spaced apart from and, viewed normal to the substrate, surrounding the doped contact region; and an interlayer dielectric film formed over the field insulating film and the plurality of plate electrodes; wherein the metal electrode includes a plurality of sections, each of which serves as a loop-shaped metal electrode, and a connection portion that connects each loop-shaped metal electrode to the doped contact region, while each of the plurality of plate electrodes is directly covered only by each associated loop-shaped metal electrode with the interlayer dielectric film interposed therebetween, and the loop-shaped metal electrode is capacitively coupled with the associated one of the plate electrodes, and a CMOS circuit, and either a resistor, a capacitor, or both, are provided in the second-conductivity-type semiconductor region surrounded by the second-conductivity-type doped contact region.

11. The semiconductor device of claim 10, being an inverter-control high-voltage semiconductor device including a high-voltage-end drive circuit, wherein the high-voltage-end drive circuit includes the CMOS circuit, and either the resistor, the capacitor, or both.

12. The semiconductor device of claim 10, wherein at least one of the loop-shaped metal electrodes is narrower in width than the plate electrodes capacitively coupled to the loop-shaped metal electrodes.

13. The semiconductor device of claim 10, wherein one of the loop-shaped metal electrodes covers the entire upper surface of that plate electrode among the plurality of plate electrodes that is located nearest the doped contact region with the interlayer dielectric film interposed between the section and the plate electrode.

14. The semiconductor device of claim 10, wherein the more distant from the doped contact region each of the loop-shaped metal electrodes is the narrower its width becomes.

15. The semiconductor device of claim 10, wherein a plurality of guard-ring regions whose conductivity is of the first type are formed in the upper portion of the semiconductor region located under an associated one of the plate electrodes.

16. The semiconductor device of claim 1 or 10, further comprising:

a surface protective film formed over the metal electrode and the interlayer dielectric film; and a plastic encapsulant formed over the surface protective film.

17. The semiconductor device of claim 16, wherein the surface protective film is a multi-layered film including an upper layer made of a polyimide resin and an insulating layer made of an inorganic material as a lower layer.

* * * * *

UNITED STATES PATENT AND TRADEMARK OFFICE
CERTIFICATE OF CORRECTION

| | |
|---|---|
| PATENT NO. | : 6,989,566 B2 |
| APPLICATION NO. | : 10/160118 |
| DATED | : January 24, 2006 |
| INVENTOR(S) | : Masaaki Noda et al. |

It is certified that error appears in the above-identified patent and that said Letters Patent is hereby corrected as shown below:

On the Title page,
Item "(56) References Cited, U.S. PATENT DOCUMENTS" change the following:

"5,881,657" to -- 5,861,657 --
"6,180,948" to -- 6,190,948 --
"5,236,100" to -- 6,236,100 --
"6,376,691" to -- 6,376,891 --
"6,628,645" to -- 6,828,645 --

Under section "(56) References Cited, FOREIGN PATENT DOCUMENTS" change the following:

"JP 2556172" to -- JP 2556175 --

Signed and Sealed this

Eleventh Day of July, 2006

JON W. DUDAS
*Director of the United States Patent and Trademark Office*